US012733428B2

(12) United States Patent
Yamamoto et al.

(10) Patent No.: US 12,733,428 B2
(45) Date of Patent: Sep. 8, 2026

(54) SUBSTRATE TREATING APPARATUS AND SUBSTRATE TREATING METHOD

(71) Applicant: SCREEN Holdings Co., Ltd., Kyoto (JP)

(72) Inventors: Shigeru Yamamoto, Kyoto (JP); Yasuhiko Nagai, Kyoto (JP); Keiji Iwata, Kyoto (JP); Takashi Akiyama, Kyoto (JP); Akira Ito, Kyoto (JP); Daiki Fujii, Kyoto (JP); Kazuki Goda, Kyoto (JP); Yosuke Nishino, Kyoto (JP); Yuya Kawai, Kyoto (JP); Kenji Edamitsu, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 18/648,197

(22) Filed: Apr. 26, 2024

(65) Prior Publication Data

US 2024/0359220 A1 Oct. 31, 2024

(30) Foreign Application Priority Data

Apr. 27, 2023 (JP) ................................ 2023-073600

(51) Int. Cl.
*H10P 72/00* (2026.01)
*B08B 3/14* (2006.01)

(52) U.S. Cl.
CPC ............ *H10P 72/0414* (2026.01); *B08B 3/14* (2013.01); *H10P 72/0402* (2026.01); *H10P 72/0404* (2026.01); *H10P 72/0448* (2026.01)

(58) Field of Classification Search
CPC ............................................. B08B 9/027–057
See application file for complete search history.

(56) References Cited

U.S. PATENT DOCUMENTS 5,711,809 A * 1/1998 Kimura .................. B05B 14/00 118/663
2017/0200624 A1* 7/2017 Higashijima ..... H01L 21/67051
(Continued)

FOREIGN PATENT DOCUMENTS

JP 2002-350049 A 12/2002
JP 2003-170182 A 6/2003
(Continued)

OTHER PUBLICATIONS

Office Action dated Nov. 15, 2024 for corresponding Taiwanese Patent Application No. 113115211.
(Continued)

*Primary Examiner* — Kaj K Olsen
*Assistant Examiner* — Richard Z. Zhang
(74) *Attorney, Agent, or Firm* — OSTROLENK FABER LLP

(57) ABSTRACT

Provided is a substrate treating apparatus for treating a substrate. The substrate treating apparatus includes a substrate treating unit configured to supply a water-insoluble water repellent to the substrate to perform water-repellent treatment to the substrate, a decomposition solution mixing mechanism configured to mix a decomposition solution for decomposing the water repellent to a water repellent-containing liquid that contains the water repellent as a waste liquid generated through the water-repellent treatment of the substrate, and a discharging unit configured to discharge a mixed liquid of the water repellent-containing liquid and the decomposition solution to an outside of the substrate treating apparatus.

7 Claims, 10 Drawing Sheets

(56) References Cited

U.S. PATENT DOCUMENTS

| | | | |
|---|---|---|---|
| 2019/0228963 | A1 | 7/2019 | Nakamori |
| 2023/0035447 | A1 | 2/2023 | Yamamoto et al. |
| 2023/0035562 | A1 | 2/2023 | Yamamoto et al. |
| 2024/0017284 | A1* | 1/2024 | Kim .................. H01L 21/67017 |

FOREIGN PATENT DOCUMENTS

| | | | |
|---|---|---|---|
| JP | 2018-149513 | A | 9/2018 |
| JP | 2022-027089 | A | 2/2022 |
| JP | 2023-020268 | A | 2/2023 |
| KR | 10-2023-0019040 | A | 2/2023 |

OTHER PUBLICATIONS

Office Action dated Nov. 15, 2024 for corresponding Korean Patent Application No. 10-2024-0054561.

Notice of Allowance dated Oct. 23, 2025 for corresponding Korean Patent Application No. 10-2024-0054561.

* cited by examiner

Fig. 1

NITROGEN GAS V2
IPA VAPOR V3
WATER REPELLENT VAPOR V4
VALVE 8
V5
V6
V7
PUMP 57
DRAIN TANK V9
SEAL WATER TANK V10
DECOMPOSITION SOLUTION
V11
V12
V13
V14
OP
CL
ON
OFF
t0
t1
t2
t3
t4
t5
t6
t7
t8
t9
t10
t11
t12
t13

1
2
3
3A
3B
3C
3D
5
7
8
9
W
11
13
15
19
21
23
25
27
29
31
33
35
41
45
47
47A
49
55
57
57A
57B
57C
59
61
63
N2
65
67
67A
69
71
73
75
81
83
85
91(43)
93(43)
101
103
121
123
131
PS1
PS2
H1
H2
H3
V1
V2
V3
V4
V5
V6
V7
V8
V9
V10
V11
V13

SUBSTRATE TREATING APPARATUS AND SUBSTRATE TREATING METHOD

CROSS-REFERENCE TO RELATED APPLICATIONS

This application claims priority to Japanese Patent Application No. 2023-073600 filed Apr. 27, 2023, the subject matter of which is incorporated herein by reference in entirety.

TECHNICAL FIELD

The present invention relates to a substrate treating apparatus and a substrate treating method for treating substrates. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

BACKGROUND ART

In the currently-used substrate treating apparatus, a substrate is immersed in a liquid, and then the substrate is picked up from the liquid and dried. In such a dry treatment of the substrate, a pattern formed on a surface of a substrate may collapse. Accordingly, the substrate treating apparatus prevents the pattern from collapsing by supplying a water repellent to the substrate (see, for example, Japanese Unexamined Patent Application Publications Nos. 2023-020268 A and 2022-027089 A).

SUMMARY OF INVENTION

Technical Problem

However, the currently-used substrate treating apparatus possess the following drawback. The water repellent includes a water-insoluble water repellent. The water-insoluble water repellent includes oil as a solvent, for example. Accordingly, when the water-insoluble water repellent is used, an oil component of the water-insoluble water repellent strongly adheres to an inner wall of a pipe. It is hard to remove the oil component, adhered to the pipe, with pure water, for example. This leads to a possibility of pipe clogging or pipe corrosion by continuous adhesion of the oil component.

Moreover, this drawback goes not only inside a substrate treating apparatus but also outside the substrate treating apparatus. Even if some countermeasure against pipe clogging as described above can be taken inside the substrate treating apparatus, it is a heavy burden on a user to take countermeasure against outside of the substrate treating apparatus (e.g., a drain facility of a factory).

The present invention has been made regarding the state of the art noted above, and its one object is to provide a substrate treating apparatus and a substrate treating method capable of preventing pipe clogging and pipe corrosion by a water-insoluble water repellent, especially at the outside of the substrate treating apparatus.

Solution to Problem

The present invention is constituted as stated below to achieve the above objects. One aspect of the present invention provides a substrate treating apparatus for treating a substrate. The substrate treating apparatus includes a substrate treating unit configured to supply a water-insoluble water repellent to the substrate to perform water-repellent treatment to the substrate, a decomposition solution mixing mechanism configured to mix a decomposition solution for decomposing the water repellent to a water repellent-containing liquid that contains the water repellent as a waste liquid generated through the water-repellent treatment, and a discharging unit configured to discharge a mixed liquid of the water repellent-containing liquid and the decomposition solution to an outside of the substrate treating apparatus.

With the substrate treating apparatus according to the aspect of the present invention, the decomposition solution mixing mechanism mixes the decomposition solution to the water repellent-containing liquid that contains the water-insoluble water repellent. The discharging unit discharges the mixed liquid of the water repellent-containing liquid and the decomposition solution to the outside of the substrate treating apparatus. The decomposition solution decomposes the water-insoluble water repellent. This prevents adhesion of a component of the water-insoluble water repellent to an inner wall of a pipe. Accordingly, pipe clogging and pipe corrosion can be prevented especially at the outside of the substrate treating apparatus. Moreover, the decomposition solution in the mixed liquid decomposes the adhered component of the water-insoluble water repellent. This yields cleaning within the pipe.

Moreover, it is preferred in the aspect of the substrate treating apparatus described above that the substrate treating unit includes a chamber configured to accommodate the substrate, and a water repellent nozzle configured to supply the water repellent to the substrate accommodated in the chamber, that the discharging unit includes a chamber drain pipe whose first end is connected to the chamber, a mixing unit connected to a second end of the chamber drain pipe, and a mixing unit drain pipe whose first end is connected to the mixing unit, that the decomposition solution mixing mechanism mixes the decomposition solution to the water repellent-containing liquid, passing through the mixing unit, via the mixing unit, and that the discharging unit discharges the mixed liquid through the mixing unit drain pipe to the outside of the substrate treating apparatus.

The decomposition solution mixing mechanism can mix the decomposition solution via the mixing unit provided between the chamber drain pipe, connected to the chamber, and the mixing unit drain pipe.

Moreover, it is preferred in the aspect of the substrate treating apparatus described above that the substrate treating unit includes a chamber configured to accommodate the substrate, and a water repellent nozzle configured to supply the water repellent to the substrate accommodated in the chamber, that the discharging unit includes a chamber drain pipe whose first end is connected to the chamber, a drain tank connected to a second end of the chamber drain pipe, and a tank drain pipe whose first end is connected to the drain tank, that the decomposition solution mixing mechanism mixes the decomposition solution to the water repellent-containing liquid, stored in the drain tank, via a supply port provided in the drain tank, and that the discharging unit discharges the mixed liquid through the tank drain pipe to the outside of the substrate treating apparatus.

The drain tank is provided between the chamber drain pipe, connected to the chamber, and the tank drain pipe. The decomposition solution mixing mechanism can mix the decomposition solution via the supply port of the drain tank.

Moreover, it is preferred in the aspect of the substrate treating apparatus described above that the discharging unit further includes a decompression pump configured to exhaust gas within the chamber and the drain tank, the decompression pump decompresses the chamber and decompresses the drain tank such that a tank pressure value in the drain tank is made lower than a chamber pressure value in the chamber, that the water repellent nozzle supplies the water repellent while the chamber is decompressed, and that the discharging unit discharges the water repellent-containing liquid stored in the chamber to the drain tank through the chamber drain pipe when the tank pressure value is lower than the chamber pressure value and the water repellent nozzle supplies the water repellent.

When the chamber is decompressed and the water repellent nozzle supplies the water repellent, the water repellent-containing liquid containing the water repellent within the chamber is discharged to the drain tank. The decomposition solution mixing mechanism can mix the decomposition solution to the water repellent-containing liquid as above.

Moreover, it is preferred in the aspect of the substrate treating apparatus described above that the discharging unit includes a water-sealing vacuum pump configured to exhaust gas within the chamber, a seal water tank configured to store seal water, a pump exhaust pipe configured to connect the water-sealing vacuum pump and the seal water tank for feeding gas in the chamber and the seal water from the water-sealing vacuum pump to the seal water tank, a circulating pipe configured to connect the seal water tank and the water-sealing vacuum pump for returning the seal water from the seal water tank to the water-sealing vacuum pump, a seal water tank exhaust pipe whose first end is connected to the seal water tank, and a seal water tank drain pipe whose first end is connected to the seal water tank, that the decomposition solution mixing mechanism mixes the decomposition solution to the seal water as the water repellent-containing liquid, stored in the seal water tank, via a supply port provided in the seal water tank, and that the discharging unit discharges the seal water through the seal water tank drain pipe to the outside of the substrate treating apparatus when discharging the seal water as the mixed liquid within the seal water tank.

The decomposition solution mixing mechanism can mix the decomposition solution to the seal water as the water repellent-containing liquid via the supply port of the seal water tank that stores the seal water used for the water-sealing vacuum pump.

Moreover, it is preferred in the aspect of the substrate treating apparatus described above that the decomposition solution mixing mechanism mixes the decomposition solution to the seal water as the water repellent-containing liquid stored in the seal water tank via the supply port provided in the seal water tank when the water-sealing vacuum pump operates for decompressing the chamber and the water repellent nozzle supplies the water repellent.

When the chamber is decompressed and the water repellent nozzle supplies the water repellent, the water-sealing vacuum pump feeds gas, containing the water repellent within the chamber, to the seal water tank. Then, the fed water repellent is to be contained in the seal water. At such a time, the decomposition solution is mixed. Consequently, the water repellent-containing liquid and the decomposition solution can be mixed immediately after the water-insoluble water repellent is contained in the seal water. Moreover, since the seal water circulates during operation of the water-sealing vacuum pump, the water repellent-containing liquid and the decomposition solution can be mixed satisfactorily.

Moreover, it is preferred in the aspect of the substrate treating apparatus described above that the discharging unit includes a water-sealing vacuum pump configured to exhaust gas within the chamber, a seal water tank configured to store seal water, a pump exhaust pipe configured to connect the water-sealing vacuum pump and the seal water tank for feeding gas in the chamber and the seal water from the water-sealing vacuum pump to the seal water tank, a circulating pipe configured to connect the seal water tank and the water-sealing vacuum pump for returning the seal water from the seal water tank to the water-sealing vacuum pump, a seal water tank exhaust pipe whose first end is connected to the seal water tank, a seal water tank drain pipe whose first end is connected to the seal water tank, a second mixing unit connected to a second end of the seal water tank drain pipe, and a second mixing unit drain pipe whose first end is connected to the second mixing unit, that the decomposition solution mixing mechanism mixes the decomposition solution to the seal water, passing through the second mixing unit, via the second mixing unit when the discharging unit discharges the seal water as the water repellent-containing liquid from the seal water tank, and that the discharging unit discharges the mixed liquid through the second mixing unit drain pipe to the outside of the substrate treating apparatus.

The decomposition solution mixing mechanism can mix the decomposition solution via the second mixing unit provided between the seal water tank drain pipe, connected to the seal water tank, and the second mixing unit drain pipe.

Moreover, it is preferred in the aspect of the substrate treating apparatus described above that the decomposition solution mixing mechanism mixes the decomposition solution to the water repellent-containing liquid stored in the chamber via a supply port provided in the chamber.

The mixed liquid of the water repellent-containing liquid and the decomposition solution can be discharged from the chamber to the outside of the substrate treating apparatus. Accordingly, pipe clogging and pipe corrosion can be prevented in the upstream inside the substrate treating apparatus.

Another aspect of the present invention provides a substrate treating method used for a substrate treating apparatus for treating a substrate. The substrate treating method includes a water repellent supplying step of supplying a water-insoluble water repellent to the substrate to perform water-repellent treatment to the substrate, a decomposition solution mixing step of mixing a decomposition solution for decomposing the water repellent to a water repellent-containing liquid that contains the water repellent as a waste liquid generated through the water-repellent treatment of the substrate, and a discharging step of discharging a mixed liquid of the water repellent-containing liquid and the decomposition solution to an outside of the substrate treating apparatus.

Advantageous Effects of Invention

With the substrate treating apparatus and the substrate treating method according to the present invention, pipe clogging and pipe corrosion by the water-insoluble water repellent can be prevented especially at the outside of the substrate treating apparatus.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 1 schematically illustrates a substrate treating apparatus according to a first embodiment.

DESCRIPTION OF EMBODIMENTS

The following describes embodiments of the present invention.

First Embodiment

Figure 1:
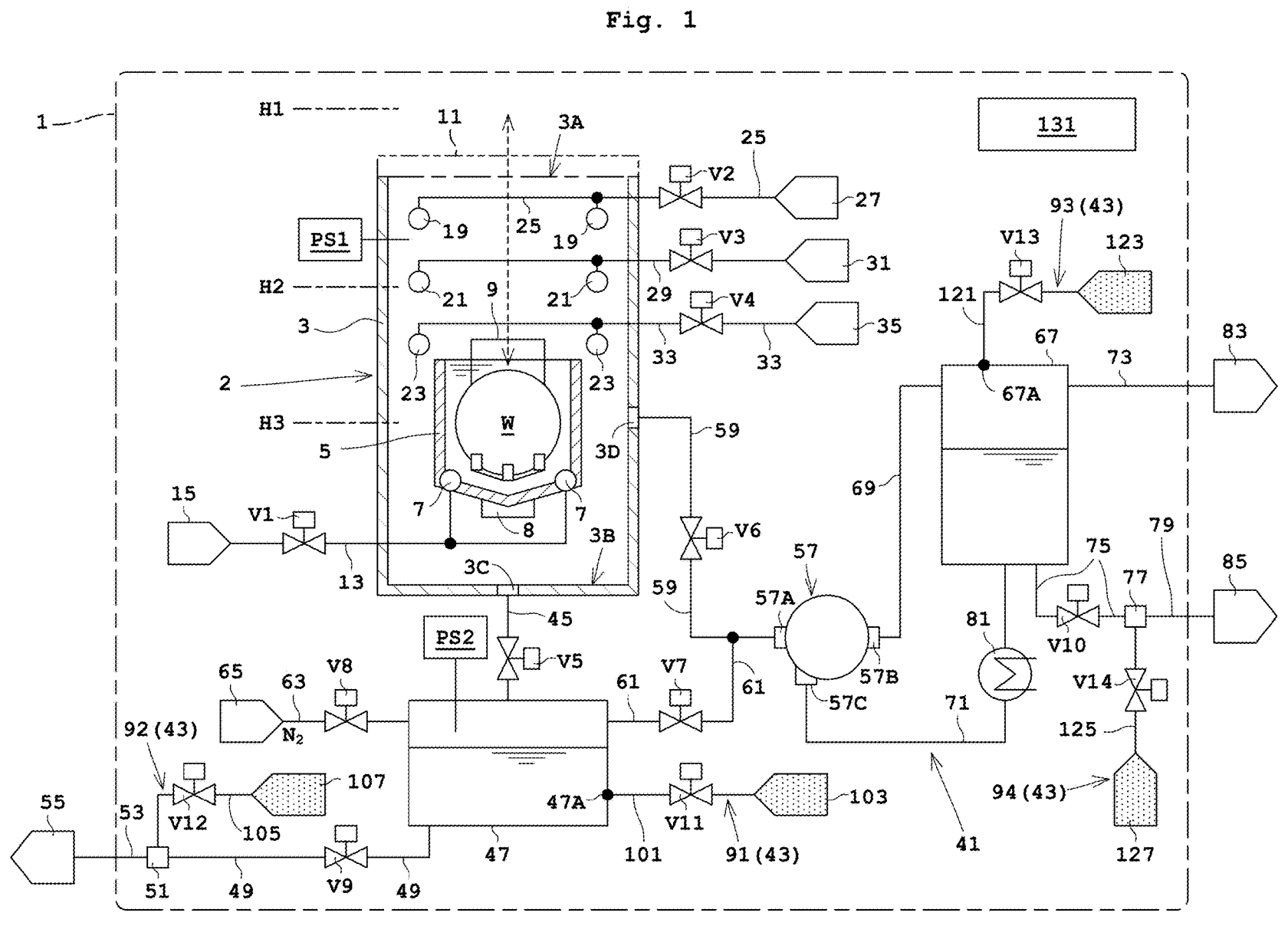
Figure 2:
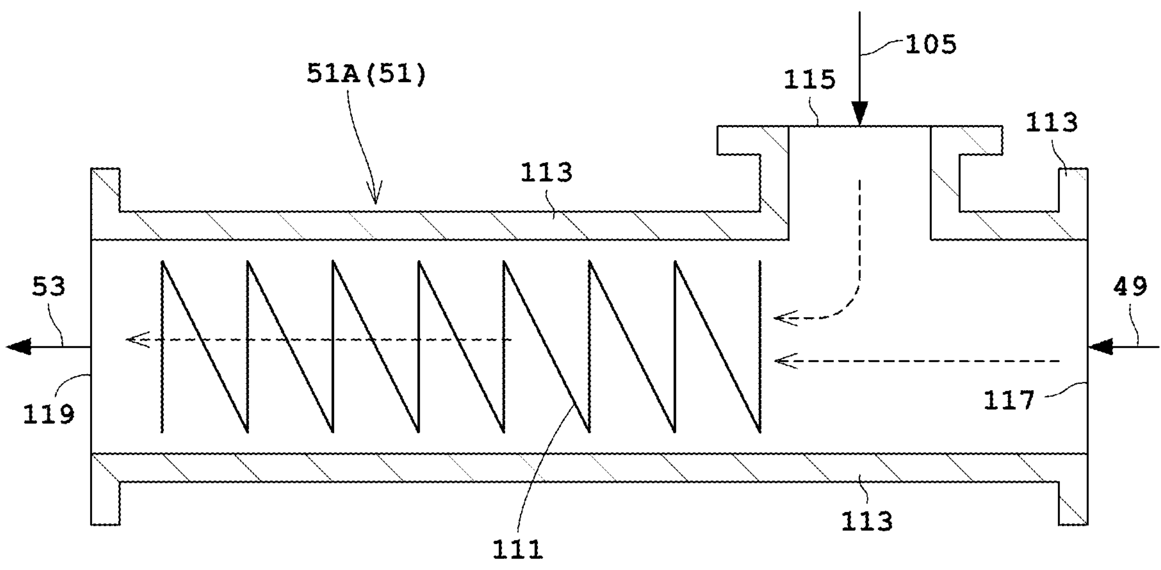
FIG. 2 is a sectional view of a mixer as one example of a first mixing unit.

A first embodiment of the present invention will now be described with reference to the drawings. FIG. 1 schematically illustrates a substrate treating apparatus 1 according to the first embodiment of the present invention. FIG. 2 is a sectional view of a mixer 51A as one example of a first mixing unit 51.

1. Construction of Substrate Treating Apparatus

Reference is made to FIG. 1. A substrate treating apparatus 1 performs pre-set treatment on a substrate W. The substrate W is formed in a disk shape. The substrate treating apparatus 1 is an apparatus of a batch type for treating a plurality of substrates W collectively. Here, the substrate treating apparatus 1 can treat one substrate W. The substrate treating apparatus 1 includes a substrate treating unit 2.

1-1. Construction of Substrate Treating Unit

The substrate treating unit 2 supplies a water-insoluble water repellent to a substrate W for performing water-repellent treatment on the substrate W, for example. The substrate treating unit 2 includes a chamber 3, a process tank 5, two jet pipes 7, a high-speed drain valve (on-off valve) 8, and a lifter 9.

The chamber 3 accommodates the substrate W. A load/unload opening 3A for loading and unloading the substrate W is provided in a top face of the chamber 3. The load/unload opening 3A is opened and closed by a shutter 11. The process tank 5 stores a treatment liquid. The process tank 5 is provided inside of and at a lower part of the chamber 3. The process tank 5 is located apart from a bottom face 3B of the chamber 3.

The two jet pipes 7 for supplying the treatment liquid into the process tank 5 are provided on both corners on the bottom of the process tank 5. The two jet pipes 7 are each connected to a first end of a treatment liquid supplying pipe 13. A second end of the treatment liquid supplying pipe 13 is connected to a treatment liquid supplying source 15. The treatment liquid supplying source 15 feeds the treatment liquid to the two jet pipes 7 via the treatment liquid supplying pipe 13. An on-off valve V1 is provided on the treatment liquid supplying pipe 13. The on-off valve V1 performs and stops supply of the treatment liquid.

As for the treatment liquid, pure water, an organic solvent, or a solution made by diluting an organic solvent with pure water. Deionized water (DIW), for example, is used as the pure water. Isopropyl alcohol (IPA), for example, is used as the organic solvent.

The high-speed drain valve (on-off valve) 8 is provided on the bottom of the process tank 5. When the high-speed drain valve 8 is opened, the high-speed drain valve 8 discharges the treatment liquid, stored in the process tank 5, to the bottom face 3B of the chamber 3 in a short time. When high-speed drain valve 8 is closed, the treatment liquid can be stored in the process tank 5.

The lifter 9 holds a plurality of substrates W in a vertical posture. The plurality of substrates W are arranged in a thickness direction thereof at predetermined intervals. The lifter 9 can hold even one substrate W. The lifter 9 moves the substrate W upward and downward among a delivery position H1, a drying position H2, and a treating position H3. The delivery position H1 is a position outside of and above the chamber 3. The drying position H2 is a position inside of the chamber 3 and above the process tank 5. The treating position H3 is a position inside of the process tank 5.

Moreover, the substrate treating unit 2 includes two inert gas nozzles 19, two solvent nozzles 21, and two water repellent nozzles 23. The six nozzles (the two inert gas nozzles 19, the two solvent nozzles 21, and the two water repellent nozzles 23) are provided within the chamber 3 and higher than the process tank 5. The two inert gas nozzles 19, the two solvent nozzles 21, and the two water-repellent nozzles 23 are arranged in this order from above.

For example, the two water repellent nozzles 23 face each other across the process tank 5 in plan view. Moreover, a first water repellent nozzle 23 is located at the same level as a second water repellent nozzle 23. The two inert gas nozzles 19, and the two solvent nozzles 21 are arranged in a similar manner. The six nozzles (the two inert gas nozzles 19, the two solvent nozzles 21, and the two water repellent nozzles 23) are each formed in a tubular shape so as to extend in an alignment direction where the substrates W are aligned. Moreover, the six nozzles (the two inert gas nozzles 19, the two solvent nozzles 21, and the two water repellent nozzles 23) each have a plurality of ejection ports that are arranged in the alignment direction.

The two inert gas nozzles 19 each supply inert gas (e.g., nitrogen gas) into the chamber 3. The two inert gas nozzles 19 are each connected to a first end of a supplying pipe 25. A second end of the supplying pipe 25 is connected to an inert gas supplying source 27. The inert gas supplying source 27 feeds inert gas to the two inert gas nozzles 19 via the supplying pipe 25. An on-off valve V2 is provided on the supplying pipe 25. The on-off valve V2 performs and stops supply of the inert gas.

The two solvent nozzles 21 each supply vapor of a solvent (e.g., isopropyl alcohol (IPA)) into the chamber 3. The two solvent nozzle 21 are each connected to a first end of a supplying pipe 29. A second end of the supplying pipe 29 is connected to a solvent vapor supplying source 31. The solvent vapor supplying source 31 feeds solvent vapor to the two solvent nozzle 21 via the supplying pipe 29. An on-off valve V3 is provided on the supplying pipe 29. The on-off valve V3 performs and stops supply of the solvent vapor.

The two water repellent nozzle 23 each supply water-insoluble water-repellent vapor to the substrate W accommodated in the chamber 3 for performing water-repellent treatment on the substrate W. The two water repellent nozzles 23 are each connected to a first end of a supplying pipe 33. A second end of the supplying pipe 33 is connected to a water-repellent vapor supplying source 35. The water-repellent vapor supplying source 35 feeds the water-insoluble water-repellent vapor to the two water repellent nozzles 23 via the supplying pipe 33. An on-off valve V4 is provided on the supplying pipe 33. The on-off valve V4 performs and stops supply of the water-repellent vapor.

The water repellent (silylating agent) contains oil as a solvent. Accordingly, the water repellent is water-insoluble. As for the water-insoluble water repellent, a water repellent is used that is manufactured by the Central Glass Co., Ltd. under a product number TJ10, for example. Here, the water-repellent vapor may contain carrier gas (inert gas such as nitrogen gas).

Moreover, the substrate treating unit 2 may include one water repellent nozzle 23 or three or more water repellent nozzles 23. The same is applicable to the jet pipes 7, the inert gas nozzles 19, and the solvent nozzles 21.

1-2. Description of Characteristic Feature of this Embodiment

The substrate treating apparatus 1 further includes a discharging unit 41 and a decomposition solution mixing mechanism 43. When the water-insoluble water repellent is used, an oil component of the water-insoluble water repellent strongly adheres to an inner wall of a pipe, which may lead to pipe clogging or pipe corrosion. This drawback goes not only inside the substrate treating apparatus 1 but also outside the substrate treating apparatus 1. Moreover, even if some countermeasure against pipe clogging as described above can be taken inside the substrate treating apparatus 1, it is a heavy burden on a user to take countermeasure against outside of the substrate treating apparatus 1 (e.g., drain facilities 55, 85 of a factory).

For example, pipe corrosion can be suppressed by forming the pipes of the substrate treating apparatus 1 with Teflon (registered trademark), i.e., fluororesin. In contrast to this, pipes of the drain facilities 55, 85 of the factory is formed with polypropylene (PP) or polyvinyl chloride (PVC), for example. Accordingly, the pipes of the drain facilities 55, 85 of the factory may be affected by the pipe clogging or the pipe corrosion.

Then, in this embodiment, the decomposition solution mixing mechanism 43 mixes a decomposition solution for decomposing the water repellent to the water repellent-containing liquid (containing the water repellent) which is a waste liquid generated during the water-repellent treatment of the substrates W. Moreover, the discharging unit 41 discharges a mixed liquid of the water repellent-containing liquid and the decomposition solution to the outside of the substrate treating apparatus 1.

1-3. Construction of Discharging Unit

The following describes a detailed construction of the discharging unit 41. The discharging unit 41 includes a chamber drain pipe 45, a drain tank 47, a tank drain pipe 49, a first mixing unit 51, and a first mixing unit drain pipe 53. The first mixing unit 51 corresponds to the mixing unit in the present invention. The first mixing unit drain pipe 53 corresponds to the mixing unit drain pipe in the present invention. The chamber drain pipe 45 and the tank drain pipe 49, or the chamber drain pipe 45 corresponds to the chamber drain pipe in the present invention.

A first end of the chamber drain pipe 45 is connected to the chamber 3. Specifically, a drain port 3C is provided in the bottom of the chamber 3, and is connected to the first end of the chamber drain pipe 45. A second end of the chamber drain pipe 45 is connected to the drain tank 47. An on-off valve V5 is provided on the chamber drain pipe 45. The on-off valve V5 can permit and block liquid flow from the chamber 3 to the drain tank 47.

The drain tank 47 is provided below the chamber 3. The drain tank 47 stores a liquid discharged from the chamber 3. The drain tank 47 has a volume larger than that of the process tank 5. Moreover, the volume of the drain tank 47 is smaller than a volume of the chamber 3, but may be larger than that of the chamber 3. The liquid discharged from the chamber 3 contains pure water, the solvent, and the water-insoluble water repellent. The liquid is called a "water repellent-containing liquid" that contains the water-insoluble water repellent.

A first end of the tank drain pipe 49 is connected to the bottom of the drain tank 47. A second end of the tank drain pipe 49 is connected to the first mixing unit 51. The details of the first mixing unit 51 is to be mentioned later. A first end of the first mixing unit drain pipe 53 is connected to the first mixing unit 51. A second end of the first mixing unit drain pipe 53 is connected to the drain facility 55 of the factory, for example, external of the substrate treating apparatus 1. The drain facility 55 and the drain facility 85 mentioned later each include a pipe.

Moreover, an on-off valve V9 is provided on the tank drain pipe 49. When the on-off valve V9 opens while the drain tank 47 is under atmospheric pressure, a liquid (water repellent-containing liquid or mixed liquid) is discharged from the drain tank 47 to the tank drain pipe 49.

Moreover, the discharging unit 41 includes a water-sealing vacuum pump 57, a chamber exhaust pipe 59, and a tank exhaust pipe 61. The water-sealing vacuum pump 57 corresponds to the decompression pump or the water-sealing vacuum pump in the present invention.

The water-sealing vacuum pump 57 takes in water called seal water to form a water ring by a centrifugal force of an impeller not shown, thereby generating a vacuum state within the pump. The water-sealing vacuum pump 57 exhausts gas within at least either the chamber 3 or the drain tank 47. The water-sealing vacuum pump 57 includes a suction port 57A, an exhaust port 57B, and a seal water supply port 57C.

A first end of the chamber exhaust pipe 59 is connected to an exhaust port 3D provided in a side wall of the chamber 3. A second end of the chamber exhaust pipe 59 is connected to the suction port 57A of the water-sealing vacuum pump 57. An on-off valve V6 is provided on the chamber exhaust pipe 59. The on-off valve V6 can regulate a flow rate of gas that flows in the chamber exhaust pipe 59. Moreover, the on-off valve V6 can permit or block the flow of gas at a regulated flow rate.

A first end of the tank exhaust pipe 61 is connected to an upper part of the drain tank 47. A second end of the tank exhaust pipe 61 is connected to the chamber exhaust pipe 59 between the on-off valve V6 and the suction port 57A. An on-off valve V7 is provided on the tank exhaust pipe 61. The on-off valve V7 can regulate a flow rate of gas that flows in the tank exhaust pipe 61. Moreover, the on-off valve V7 can permit or block the flow of gas at a regulated flow rate.

Moreover, the discharging unit 41 includes a supplying pipe 63, an inert gas supplying source 65, and an on-off valve V8 for returning the tank pressure value in the drain tank 47 to atmospheric pressure. A first end of the supplying pipe 63 is connected to the drain tank 47. A second end of the supplying pipe 63 is connected to the inert gas supplying source 65. The inert gas supplying source 65 feeds inert gas (e.g., nitrogen gas) to the drain tank 47 via the supplying pipe 63. The on-off valve V8 is provided on the supplying pipe 63. The on-off valve V8 performs and stops supply of the inert gas.

Moreover, the discharging unit 41 includes a seal water tank 67, a pump exhaust pipe 69, a circulating pipe 71, a seal water tank exhaust pipe 73, a seal water tank drain pipe 75, a second mixing unit 77, and a second mixing unit drain pipe 79.

The seal water tank 67 stores seal water. A seal water supplying unit not shown can supply pure water (e.g., DIW) as the seal water to the seal water tank 67. The pump exhaust pipe 69 connects the exhaust port 57B of the water-sealing vacuum pump 57 to an upper part of the seal water tank 67 in order to feed gas and the seal water in the chamber 3 from the water-sealing vacuum pump 57 to the seal water tank 67.

The circulating pipe 71 connects the bottom of the seal water tank 67 to the seal water supply port 57C of the water-sealing vacuum pump 57 in order to return the seal water from seal water tank 67 to the water-sealing vacuum pump 57. A heat exchanger 81 is provided on the circulating pipe 71. The heat exchanger 81 cools the seal water that flows in the circulating pipe 71. Here, the seal water contains a solvent and the water-insoluble water repellent. That is, the seal water containing the water-insoluble water repellent is a water repellent-containing liquid.

A first end of the seal water tank exhaust pipe 73 is connected to an upper part of the seal water tank 67. A second end of the seal water tank exhaust pipe 73 is connected to an exhaust facility 83 of the factory, for example, external of the substrate treating apparatus 1. The seal water tank exhaust pipe 73 feeds gas from the chamber 3 to the exhaust facility 83, the gas being supplied by the water-sealing vacuum pump 57 to the seal water tank 67.

A first end of the seal water tank drain pipe 75 is connected to a lower part or the bottom of the seal water tank 67. A second end of the seal water tank drain pipe 75 is connected to the second mixing unit 77. An on-off valve V10 is provided on the seal water tank drain pipe 75. The on-off valve V10 performs and stops discharge of the seal water within the seal water tank 67. That is, when the on-off valve V10 is closed, the seal water within the seal water tank 67 is not discharged through the seal water tank drain pipe 75. Moreover, when the on-off valve V10 is opened, the seal water within the seal water tank 67 is discharged through the seal water tank drain pipe 75. The second mixing unit 77 is configured in the same manner as the first mixing unit 51. A first end of the second mixing unit drain pipe 79 is connected to the second mixing unit 77. A second end of the second mixing unit drain pipe 79 is connected to the drain facility 85 of the factory external of the substrate treating apparatus 1.

At least one selected from the chamber drain pipe 45, the tank drain pipe 49, the first mixing unit drain pipe 53, the chamber exhaust pipe 59, the tank exhaust pipe 61, the pump exhaust pipe 69, the circulating pipe 71, the seal water tank drain pipe 75, and the second mixing unit drain pipe 79 is formed with fluororesin. Accordingly, resistance to corrosion by the water-insoluble water repellent is obtained, whereby corrosion of the chamber drain pipe 45 and the like can be suppressed. The fluororesin is, for example, polytetrafluoroethylene (PTFE) or polytetrafluoroethylene (PFA).

1-4. Construction of Decomposition Solution Mixing Mechanism

In this embodiment, the decomposition solution mixing mechanism 43 includes a first decomposition solution mixing unit 91, a second decomposition solution mixing unit 92, a third decomposition solution mixing unit 93, and a fourth decomposition solution mixing unit 94.

The first decomposition solution mixing unit 91 mixes a decomposition solution to a liquid (water repellent-containing liquid) stored in the drain tank 47 through a supply port 47A provided in the drain tank 47. For example, the first decomposition solution mixing unit 91 mixes a constant quantity (pre-set quantity) of decomposition solution. The first decomposition solution mixing unit 91 includes a first decomposition solution pipe 101, a first decomposition solution supplying source 103, and an on-off valve V11.

A first end of the first decomposition solution pipe 101 is connected to the supply port 47A. A second end of the first decomposition solution pipe 101 is connected to the first decomposition solution supplying source 103. The decomposition solution in the first decomposition solution supplying source 103 is fed to the drain tank 47 through the first decomposition solution pipe 101 by a pump not shown. The on-off valve V11 is provided on the first decomposition solution pipe 101. The on-off valve V11 performs and stops supply of the decomposition solution. On-off valves V12, V13, and V14 mentioned later are configured in the same manner as the on-off valve V11.

The decomposition solution decomposes especially an oil component of the water-insoluble water repellent. As for the decomposition solution, an emulsifier (surfactant) or bacteria are used, for example. Moreover, as for the decomposition solution, a mixture of an emulsifier or bacteria with pure water (DIW) may be adopted, for example. When an emulsifier is added to the water-insoluble water repellent, the oil component can be fined and dispersed in water. It should be noted that, when bacteria are added, it sometimes takes a time for sufficient decomposition.

When a mixed liquid of the water repellent-containing liquid and the decomposition solution within the drain tank 47 is discharged, the discharging unit 41 discharges the mixed liquid of the water repellent-containing liquid and the decomposition solution to the drain facility 55 outside of the substrate treating apparatus 1 through the tank drain pipe 49 and the first mixing unit drain pipe 53.

Next, description will be made of the second decomposition solution mixing unit 92. When the liquid (water repellent-containing liquid) is discharged from the drain tank 47, the second decomposition solution mixing unit 92 mixes the decomposition solution to a liquid, passing the first mixing unit 51, via the first mixing unit 51. For example, the second decomposition solution mixing unit 92 mixes the decomposition solution for a constant period of time (pre-set period of time). The second decomposition solution mixing unit 92 includes a second decomposition solution pipe 105, a second decomposition solution supplying source 107, and an on-off valve V12.

A first end of the second decomposition solution pipe 105 is connected to the first mixing unit 51. A second end of the second decomposition solution pipe 105 is connected to the second decomposition solution supplying source 107. The decomposition solution in the second decomposition solution supplying source 107 is fed to the first mixing unit 51 through the second decomposition solution pipe 105 by a pump not shown. The on-off valve V12 is provided on the second decomposition solution pipe 105.

The first mixing unit 51 is constituted by a mixer 51A, shown in FIG. 2, provided with a mixer body 111, or a mixing valve, for example. The mixing valve can change a mixing ratio of the liquid (water repellent-containing liquid) from the drain tank 47 and the decomposition solution. Reference is made to FIG. 2. The mixer 51A (first mixing unit 51) includes the mixer body 111, a pipe 113, a supply port 115, an inlet 117, and an outlet 119.

The mixer body 111 is a member for mixing the decomposition solution with the liquid (water repellent-containing liquid). The mixer body 111 is located downstream of the supply port 115 and the inlet 117 in the pipe 113. The mixer body 111 is formed so as to extend helically along a pipe axis. Here, the mixer body 111 may be formed by arranging a clockwise helical member and a counterclockwise helical member in series. A first end of the second decomposition solution pipe 105 is connected to the supply port 115. The second end of the tank drain pipe 49 is connected to the inlet 117. The first end of the first mixing unit drain pipe 53 is connected to the outlet 119.

Description is now made of operation of the mixer 51A. The water repellent-containing liquid flows through the inlet 117, and the decomposition solution is supplied through the supply port 115. Thereafter, when the water repellent-containing liquid and the decomposition solution pass through the mixer body 111, the mixer body 111 mixes the water repellent-containing liquid and the decomposition solution. Then, the mixed liquid of the water repellent-containing liquid and the decomposition solution is fed to the first mixing unit drain pipe 53 through the outlet 119.

When the second decomposition solution mixing unit 92 mixes the decomposition solution, the discharging unit 41 discharges the mixed liquid of the water repellent-containing liquid and the decomposition solution to the drain facility 55 outside of the substrate treating apparatus 1 through the first mixing unit drain pipe 53.

Next, description will be made of the third decomposition solution mixing unit 93. The third decomposition solution mixing unit 93 mixes a decomposition solution to the seal water as the water repellent-containing liquid stored in the seal water tank 67 through a supply port 67A provided in the seal water tank 67. For example, the third decomposition solution mixing unit 93 mixes a constant quantity (pre-set quantity) of decomposition solution. The third decomposition solution mixing unit 93 includes a third decomposition solution pipe 121, a third decomposition solution supplying source 123, and an on-off valve V13.

A first end of the third decomposition solution pipe 121 is connected to the supply port 67A. A second end of the third decomposition solution pipe 121 is connected to the third decomposition solution supplying source 123. The decomposition solution in the third decomposition solution supplying source 123 is fed to the seal water tank 67 through the third decomposition solution pipe 121 by a pump not shown. The on-off valve V13 is provided on the third decomposition solution pipe 121.

When the seal water as the mixed liquid of the water repellent-containing liquid and the decomposition solution within the seal water tank 67 is discharged, the discharging unit 41 discharges the seal water to the drain facility 85 outside of the substrate treating apparatus 1 through the seal water tank drain pipe 75 and the second mixing unit drain pipe 79.

Next, description will be made of the fourth decomposition solution mixing unit 94. When the discharging unit 41 discharges the seal water (water repellent-containing liquid) from the seal water tank 67, the fourth decomposition solution mixing unit 94 mixes the decomposition solution to the seal water, passing the second mixing unit 77, via the second mixing unit 77. For example, the fourth decomposition solution mixing unit 94 mixes the decomposition solution for a constant period of time (pre-set period of time). The fourth decomposition solution mixing unit 94 includes a fourth decomposition solution pipe 125, a fourth decomposition solution supplying source 127, and an on-off valve V14.

A first end of the fourth decomposition solution pipe 125 is connected to the second mixing unit 77. A second end of the fourth decomposition solution pipe 125 is connected to the fourth decomposition solution supplying source 127. The decomposition solution in the fourth decomposition solution supplying source 127 is fed to the second mixing unit 77 through the fourth decomposition solution pipe 125 by a pump not shown. The on-off valve V14 is provided on the fourth decomposition solution pipe 125. The second mixing unit 77 is configured in the same manner as the first mixing unit 51.

When the fourth decomposition solution mixing unit 94 mixes the decomposition solution, the discharging unit 41 discharges the seal water as the mixed liquid of the water repellent-containing liquid and the decomposition solution to the drain facility 85 outside of the substrate treating apparatus 1 through the second mixing unit drain pipe 79.

1-5. Other Construction

A pressure sensor PS1 is provided in the chamber 3 for measuring pressure within the chamber 3. Moreover, a pressure sensor PS2 is provided in the drain tank 47 for measuring pressure within the drain tank 47.

The substrate treating apparatus 1 includes a controller 131 and a memory unit (not shown). The controller 131 controls components of the substrate treating apparatus 1. The controller 131 includes one or more processors like a central processing unit (CPU). The memory unit includes, for example, at least one of a read-only memory (ROM), a random-access memory (RAM), and a hard disk. The memory unit stores computer programs necessary for controlling each component of the substrate treating apparatus 1.

2. Operation of Substrate Treating Apparatus

Next, description will be given of operation of the substrate treating apparatus 1 with reference to a timing chart in FIG. 3. Note that, in FIG. 3, a numeral CL denotes a closed state of a valve V2 and the like, and a numeral OP denotes an opened state of the valve V2 and the like. Moreover, FIGS. 4 to 7 each illustrate operation of four decomposition solution mixing units (first decomposition solution mixing unit 91, second decomposition solution mixing unit 92, third decomposition solution mixing unit 93, and fourth decomposition solution mixing unit 94).

At time points t0 to t1, the lifter 9 receives a substrate W at the delivery position H1 from a transport robot not shown. The lifter 9 holds the substrate W in a vertical posture. Pure water jetted from the jet pipe 7 is stored in the process tank 5. Moreover, the on-off valve V2 is opened and the inert gas nozzle 19 supplies nitrogen gas into the chamber 3. A pressure value in the chamber 3 is equal to or larger than an atmospheric pressure value.

The lifter 9 moves the substrate W downward from the delivery position H1 to the treating position H3. Accordingly, the substrate W is immersed in pure water in the process tank 5 to be subjected to pure water cleaning treatment. Here, after the substrate W is moved downward to the treating position H3, the shutter 11 shuts the load/unload opening 3A.

Figure 3:
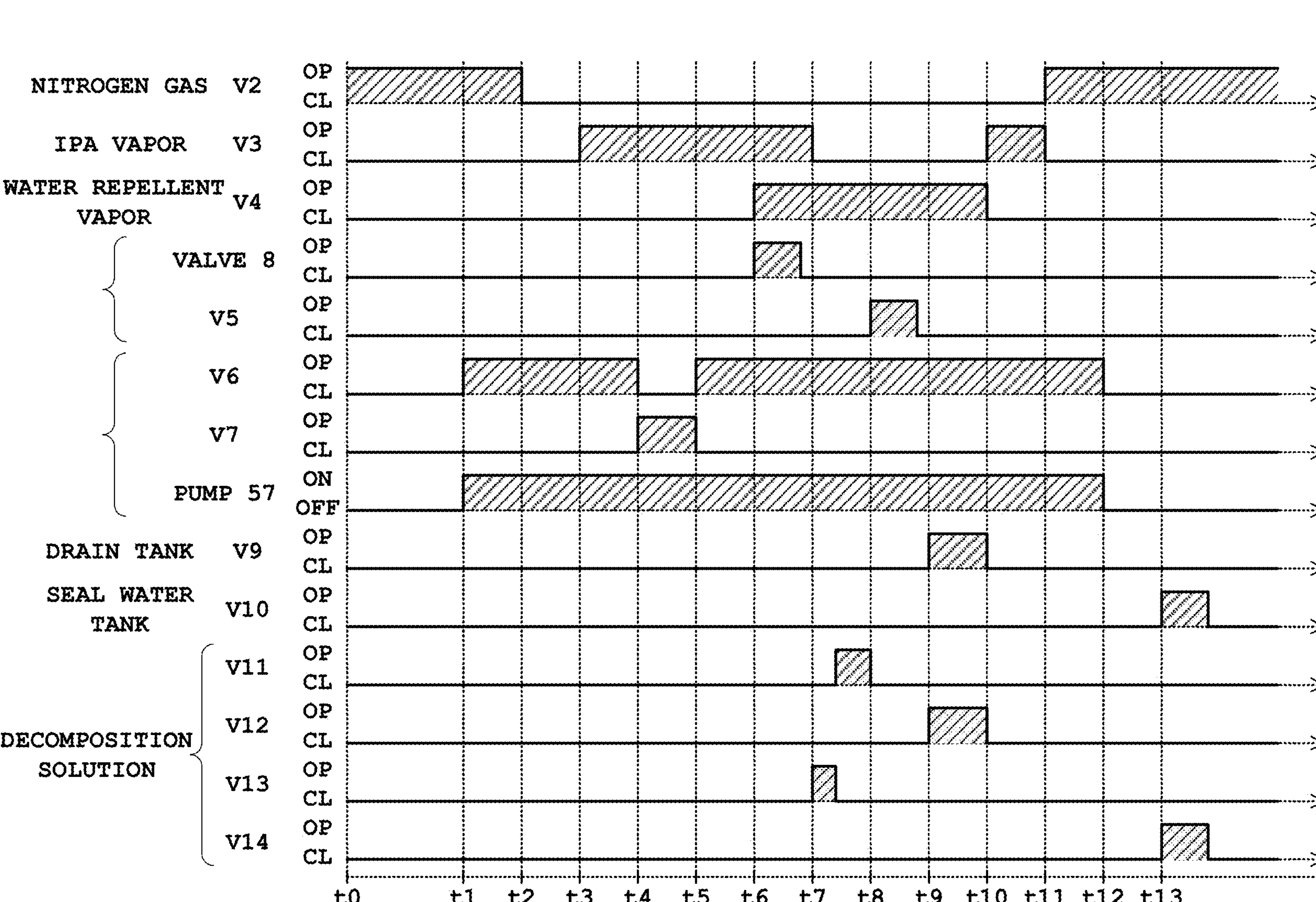
FIG. 3 is a timing chart illustrating operation of the substrate treating apparatus according to the first embodiment.

At the time point t1, the on-off valve V6 is opened and the water-sealing vacuum pump 57 actuates (numeral ON in FIG. 3). Thereby, gas within the chamber 3 is exhausted. The water-sealing vacuum pump 57 decompresses the chamber 3 to a pre-set pressure value (chamber pressure value) based on a determined value by the pressure sensor PS1. The pre-set pressure value is lower than an atmospheric pressure value.

Now, the water-sealing vacuum pump 57 actuates from the time point t1 to a time point t12. Moreover, when the on-off valve V6 is opened and the water-sealing vacuum pump 57 actuates, gas within the chamber 3 is fed to the chamber exhaust pipe 59, the water-sealing vacuum pump 57, the pump exhaust pipe 69, the seal water tank 67, the seal water tank exhaust pipe 73, and the exhaust facility 83 in this order. Here, gas is separated from the liquid (e.g., pure water, solvent, and water repellent) in the seal water tank 67. Moreover, the solvent and the water repellent contained in the gas from the chamber 3 are to be contained in the seal water.

Moreover, when the water-sealing vacuum pump 57 actuates, the seal water in the seal water tank 67 circulates to the circulating pipe 71, the water-sealing vacuum pump 57, the pump exhaust pipe 69, and the seal water tank 67 in this order. Moreover, the seal water is cooled with the heat exchanger 81 provided on the circulating pipe 71. Moreover, when the seal water is reduced, a pure water supplying unit not shown supplies pure water to the seal water tank 67.

At a time point t2, the on-off valve V2 is closed to stop supply of nitrogen gas from the inert gas nozzles 19. Thereafter, at a time point t3, the on-off valve V3 is opened to supply IPA vapor from the solvent nozzle 21 to the chamber 3. This makes the chamber 3 under an atmosphere of the IPA vapor under reduced pressure. Thereafter, the lifter 9 moves the substrate W upward from the treating position H3 to the drying position H2 while picking up the substrate W out of the pure water in the process tank 5. Accordingly, water adhered to the substrate W is replaced by IPA. The solvent nozzle 21 supplies IPA vapor during a period from the time point t3 to a time point t7.

At a time point t4, the chamber pressure value in the chamber 3 is reduced to the pre-set pressure value by the water-sealing vacuum pump 57. If a tank pressure value in the drain tank 47 is larger than the chamber pressure value in the chamber 3 under such a condition, it is impossible to feed a liquid from the chamber 3 to the drain tank 47. Accordingly, at the time point t4, the on-off valve V6 is closed and the on-off valve V7 is opened. Thereby, gas within the drain tank 47 is exhausted.

Moreover, the water-sealing vacuum pump 57 decompresses the drain tank 47 based on the measured value by the pressure sensor PS2 such that the tank pressure value in the drain tank 47 is made lower than the chamber pressure value in the chamber 3 (tank pressure value<chamber pressure value).

Now, when gas within the drain tank 47 is exhausted, the on-off valves V5, V8, and V9 are closed. Moreover, when the on-off valve V7 is opened and the water-sealing vacuum pump 57 actuates, gas within the drain tank 47 is fed to the tank exhaust pipe 61, the water-sealing vacuum pump 57, the pump exhaust pipe 69, the seal water tank 67, the seal water tank exhaust pipe 73, and the exhaust facility 83 in this order.

At a time point t5, the tank pressure value in the drain tank 47 is made to be a pre-set pressure value smaller than the chamber pressure value. At the time point t5, the on-off valve V7 is closed and the on-off valve V6 is opened. Thereby, gas within the chamber 3 is exhausted. Here, a relationship that the tank pressure value is smaller than the chamber pressure value is maintained.

At a time point t6, the water repellent nozzle 23 supplies the water-insoluble water-repellent vapor to the chamber 3 while the chamber 3 is decompressed. The water-insoluble water-repellent vapor is supplied during a period from the time point t6 to a time point t10. Moreover, at the time point t6, the high-speed drain valve 8 is opened and all the pure water within the process tank 5 is discharged to the bottom face 3B in the chamber 3. Accordingly, the pure water is stored on the bottom in the chamber 3. After the process tank 5 is empty, the high-speed drain valve 8 is closed.

At the time point t7, the on-off valve V3 is closed to stop supply of the IPA from the solvent nozzle 21. Moreover, the water repellent nozzle 23 continuously supplies the water-insoluble water-repellent vapor. Moreover, the lifter 9 moves the substrate W upward and downward so as to pass the substrate W between the two water repellent nozzles 23. Accordingly, the IPA adhered to the substrate W is replaced by the water-insoluble water repellent. Thereby, a surface of the substrate W, especially a device face is reformed to have repellency (water-repellent treatment).

Moreover, during a period from the time point t6 to the time point t10 in FIG. 3, the water-repellent vapor is supplied. Accordingly, the water-sealing vacuum pump 57 exhausts gas, containing the water-insoluble water-repellent vapor, from inside of the chamber 3. Consequently, the water-insoluble water repellent is mixed to the seal water. The waste liquid of the water-insoluble water repellent causes pipe clogging and pipe corrosion.

Figure 6:
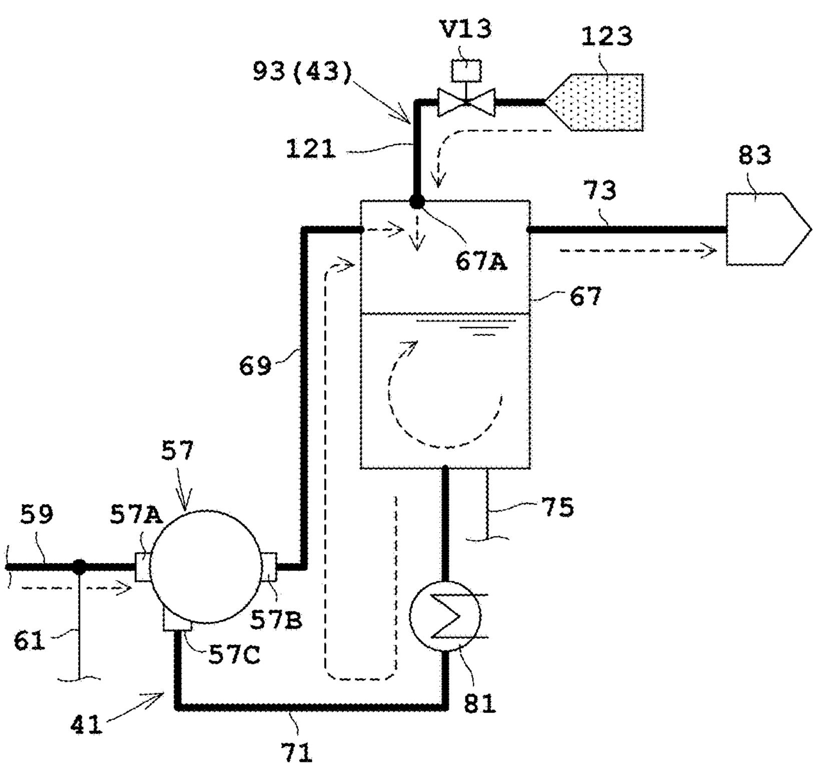
FIG. 6 illustrates operation of a third decomposition solution mixing unit.

Now in FIG. 6, when the water-sealing vacuum pump 57 actuates to decompress the chamber 3 and the water repellent nozzle 23 supplies the water repellent, the third decomposition solution mixing unit 93 opens the on-off valve V13. For example, at the time point t7, the on-off valve V13 is opened. Thereby, the third decomposition solution mixing unit 93 mixes a decomposition solution to the seal water as the water repellent-containing liquid in the seal water tank 67 through a supply port 67A provided in the seal water tank 67.

Consequently, the water-insoluble water repellent mixed in the seal water can be decomposed with the decomposition solution. Moreover, since the seal water circulates, the seal water containing the water-insoluble water repellent (water repellent-containing liquid) and the decomposition solution can be mixed satisfactorily. For example, the water repellent can be decomposed rapidly.

Moreover, at a period from the time point t6 to the time point t7 in FIG. 3, the high speed drain valve 8 is opened, whereby the pure water is stored on the bottom in the chamber 3. The pure water also contains the water-insoluble water repellent generated in the water-repellent treatment. Here, the pure water containing the water-insoluble water repellent is a water repellent-containing liquid.

Here, at a time point t8, the on-off valve V5 is opened under a condition that the tank pressure value is smaller than the chamber pressure value and when the water repellent nozzle 23 supplies the water-insoluble water-repellent vapor. In other words, when the tank pressure value is lower than the chamber pressure value and the water repellent nozzle 23 supplies the water repellent vapor, the discharging unit 41 discharges the water repellent-containing liquid stored in the chamber 3 to the drain tank 47 through the chamber drain pipe 45. Accordingly, it is possible to discharge the water repellent-containing liquid within the chamber 3 to the drain tank 47. When moistures volatilize from the water repellent-containing liquid stored on the bottom of the decompressed chamber 3 and adhere to the substrate W, effectiveness of the water-repellent treatment is reduced, and dust caused by the water repellent is generated. However, such can be prevented.

Moreover, the first decomposition solution mixing unit 91 opens the on-off valve V11 before or while the water repellent-containing liquid stored in the chamber 3 is discharged from the chamber 3 to the drain tank 47. For example, the on-off valve V11 is opened before the time point t8.

Figure 4:
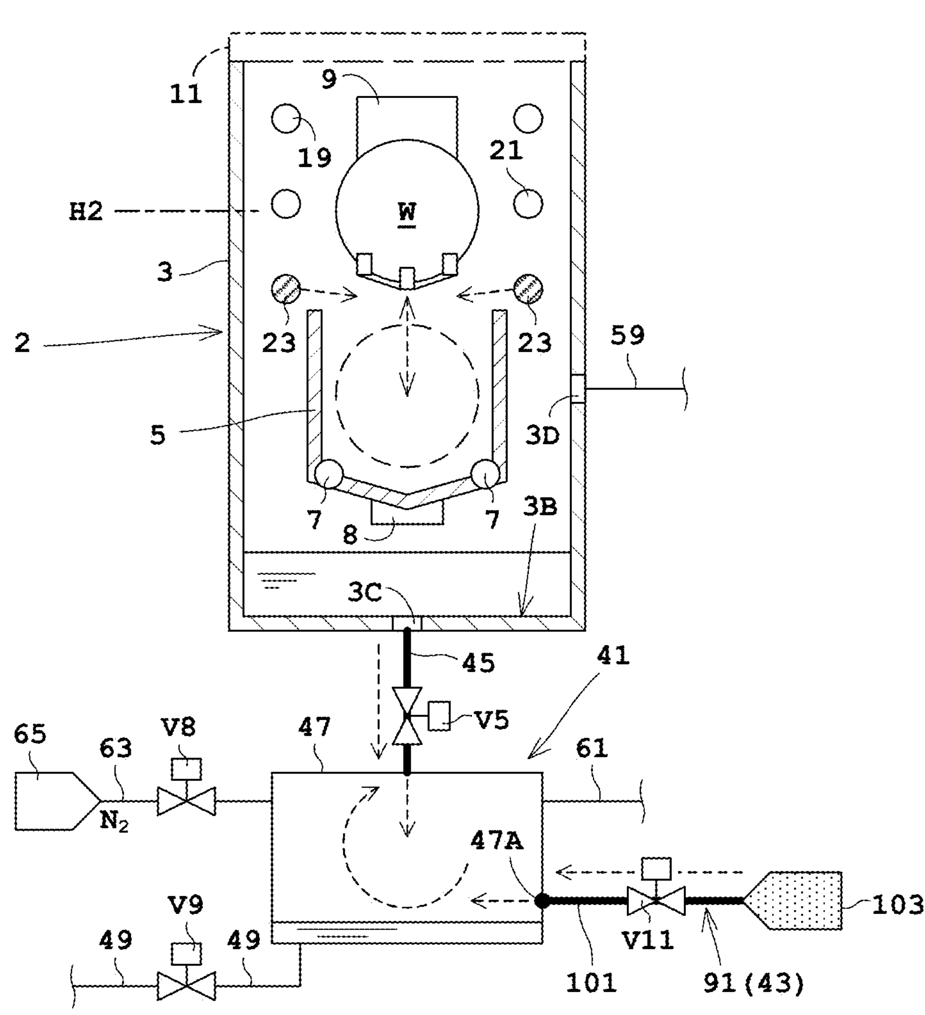
FIG. 4 illustrates operation of a first decomposition solution mixing unit.

Accordingly, the first decomposition solution mixing unit 91 supplies the decomposition solution into the drain tank 47 in order to mix the decomposition solution to the water repellent-containing liquid stored in the drain tank 47 through the supply port 47A provided in the drain tank 47 as shown in FIG. 4. Accordingly, it is possible to mix the water repellent-containing liquid and the decomposition solution satisfactorily by flow of the water repellent-containing liquid entering the drain tank 47. The water-insoluble water repellent within the drain tank 47 is decomposed with the decomposition solution.

Thereafter, when the water repellent-containing liquid on the bottom in the chamber 3 is eliminated, the on-off valve V5 is closed. Thereafter, the on-off valve V8 is opened, and the nitrogen gas is supplied into the drain tank 47. Accordingly, pressure of the decompressed drain tank 47 returns to atmospheric pressure. The on-off valve V8 is opened and closed appropriately.

Figure 5:
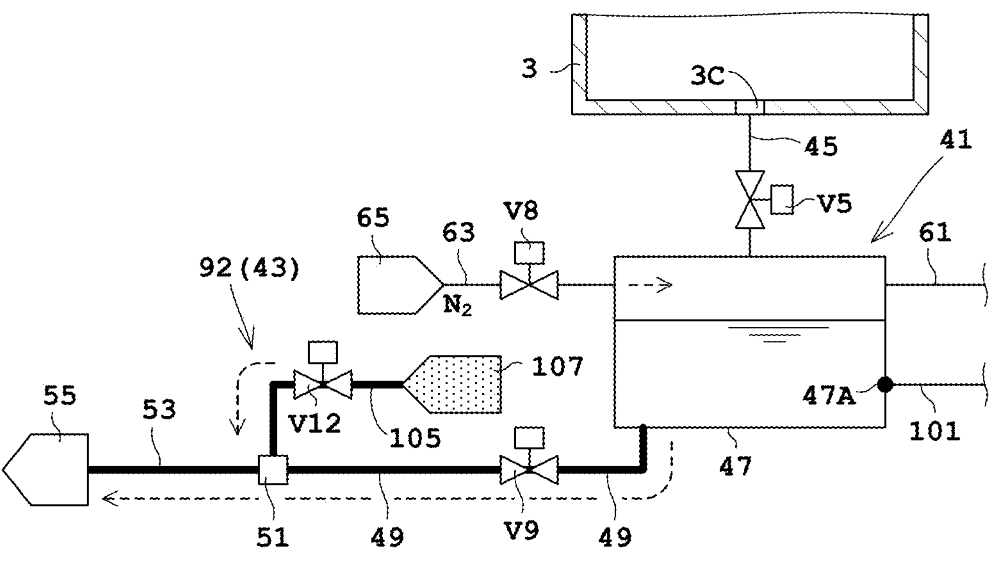
FIG. 5 illustrates operation of a second decomposition solution mixing unit.

Thereafter, the on-off valve V9 is opened at a time point t9. Specifically, the discharging unit 41 discharges the liquid (the mixed liquid of the water repellent-containing liquid and the decomposition solution in this embodiment) within the drain tank 47 to the drain facility 55 through the tank drain pipe 49 and the first mixing unit drain pipe 53. At this time (time point t9), the second decomposition solution mixing unit 92 mixes the decomposition solution to the liquid (mixed liquid), passing the first mixing unit 51, via the first mixing unit 51 as shown in FIG. 5. The decomposition solution from the second decomposition solution mixing unit 92 decomposes the water-insoluble water repellent. More decomposition solution is mixed, ensuring decomposition of the water-insoluble water repellent. Moreover, the downstream pipe can be cleaned by decomposing the oil component of the water repellent adhering to the downstream pipe.

The mixed liquid where the decomposition solution is further mixed by the first mixing unit 51 is fed to the drain facility 55. When all the liquid in the drain tank 47 is discharged, the on-off valve V9 is closed. Here, the second decomposition solution mixing unit 92 may continuously supply the decomposition solution for a pre-set period of time after the on-off valve V9 is closed.

At the time point t10, the on-off valve V4 is closed to stop supply of the water-repellent vapor from the water repellent nozzle 23. Moreover, the on-off valve V3 is opened to supply IPA vapor from the solvent nozzle 21. Accordingly, the water repellent adhered to the substrate W is replaced by IPA.

Thereafter, at a time point t11, the on-off valve V3 is closed to stop supply of the IPA vapor from the solvent nozzle 21. Moreover, the on-off valve V2 is opened to supply nitrogen gas from the inert gas nozzles 19. From the above, the IPA adhered to the substrate W volatilizes for performing dry treatment on the substrate W in the decompressed chamber 3.

Thereafter, at a time point t12, the water-sealing vacuum pump 57 stops actuating (OFF) and the on-off valve V6 is closed. Supplying nitrogen gas returns the pressure of the chamber 3 to atmospheric pressure. Then, the shutter 11 is opened. Then, the lifter 9 moves the substrate W upward from the drying position H2 to the delivery position H1. The transport robot not shown receives the substrate W from the lifter 9, and delivers the substrate W to a next destination.

Figure 7:
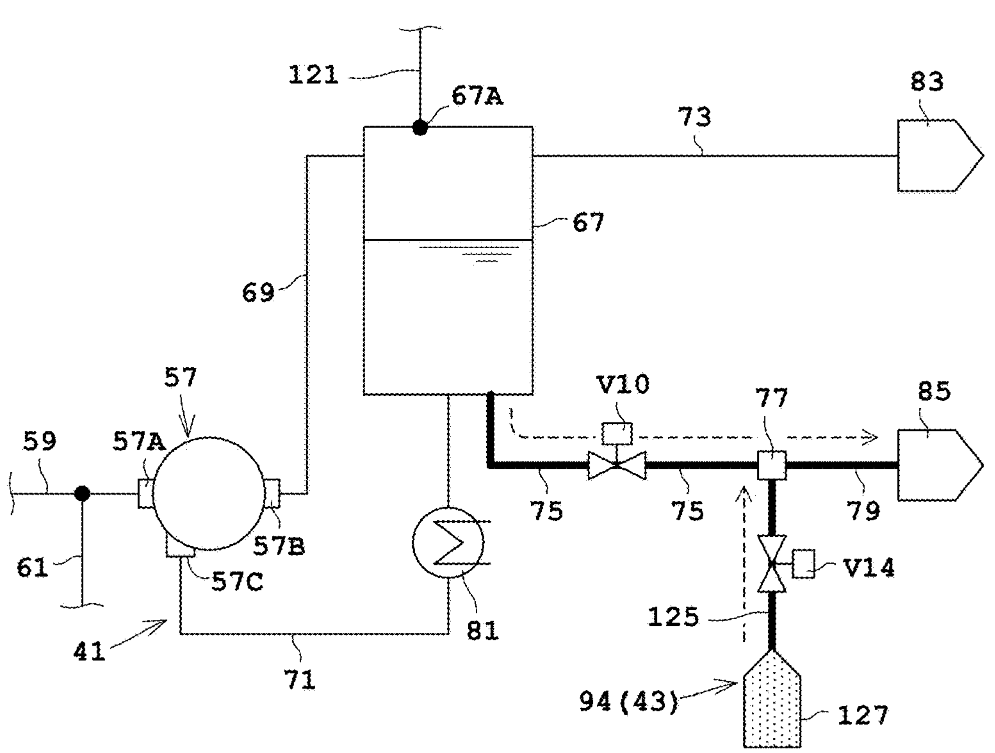
FIG. 7 illustrates operation of a fourth decomposition solution mixing unit.

At a time point t13 after the time point t12, the on-off valve V10 is opened to discharge the seal water (mixed liquid of the water repellent-containing liquid and the decomposition solution in this embodiment) within the seal water tank 67 while the water-sealing vacuum pump 57 stops. At this time, the fourth decomposition solution mixing unit 94 mixes the decomposition solution to the seal water, passing the second mixing unit 77, via the second mixing unit 77 as shown in FIG. 7. The decomposition solution from the fourth decomposition solution mixing unit 94 decomposes the water-insoluble water repellent. More decomposition solution is mixed with the seal water discharged from the seal water tank 67, ensuring decomposition of the water-insoluble water repellent. Moreover, when the oil component of the water repellent adheres to the downstream pipe, the downstream pipe can be cleaned by decomposing the oil component.

The mixed liquid where the decomposition solution is further mixed by the second mixing unit 77 is fed to the drain facility 85. When the seal water in the seal water tank 67 is discharged, the on-off valve V10 is closed. A pure water supplying unit not shown supplies pure water to the seal water tank 67. Moreover, the fourth decomposition solution mixing unit 94 may continuously mix the decomposition solution for a pre-set period of time after the on-off valve V10 is closed. Thereafter, the procedure returns to the time point t0 and a next substrate W is to be treated.

With this embodiment, the decomposition solution mixing mechanism 43 mixes the decomposition solution to the water repellent-containing liquid that contains the water-insoluble water repellent. The discharging unit 41 discharges the mixed liquid of the water repellent-containing liquid and the decomposition solution to the outside of the substrate treating apparatus 1. The decomposition solution decomposes the water-insoluble water repellent. This prevents adhesion of a component of the water-insoluble water repellent to an inner wall of a pipe. Accordingly, pipe clogging and pipe corrosion can be prevented especially at the outside of the substrate treating apparatus 1. Moreover, the decomposition solution in the mixed liquid decomposes the adhered component of the water-insoluble water repellent. This yields cleaning within the pipe.

The drain tank 47 is provided between the chamber drain pipe 45, connected to the chamber 3, and the tank drain pipe 49. The first decomposition solution mixing unit 91 can mix the decomposition solution via the supply port 47A of the drain tank 47.

Moreover, when the chamber 3 is decompressed and the water repellent nozzle 23 supplies the water repellent, the water repellent-containing liquid containing the water repellent within the chamber 3 is discharged to the drain tank 47. The first decomposition solution mixing unit 91 can mix the decomposition solution to the water repellent-containing liquid as above.

The second decomposition solution mixing unit 92 can mix the decomposition solution via the first mixing unit 51 provided between the drain pipes (chamber drain pipe 45 and tank drain pipe 49), connected to the chamber 3, and the first mixing unit drain pipe 53.

The third decomposition solution mixing unit 93 can mix the decomposition solution to the seal water as the water repellent-containing liquid via the supply port 67A of the seal water tank 67 that stores the seal water used for the water-sealing vacuum pump 57.

When the chamber 3 is decompressed and the water repellent nozzle 23 supplies the water repellent, water-sealing vacuum pump 57 feeds gas, containing the water repellent within the chamber 3, to the seal water tank 67. Then, the fed water repellent is to be contained in the seal water. At such a time, the decomposition solution is mixed. Consequently, the water repellent-containing liquid and the decomposition solution can be mixed immediately after the water-insoluble water repellent is contained in the seal water. Moreover, since the seal water circulates during operation of the water-sealing vacuum pump 57, the water repellent-containing liquid and the decomposition solution can be mixed satisfactorily.

The fourth decomposition solution mixing unit 94 can mix the decomposition solution via the second mixing unit 77 provided between the seal water tank drain pipe 75, connected to the seal water tank 67, and the second mixing unit drain pipe 79.

This embodiment may be modified as under. A timing of supplying the decomposition solution is not limited to the case in FIG. 3. For example, when the on-off valve V9 is opened to discharge the water repellent-containing liquid from the drain tank 47 at a timing after the time point t12, the second decomposition solution mixing unit 92 may mix the decomposition solution by opening of the on-off valve V12.

Moreover, the third decomposition solution mixing unit 93 may mix the decomposition solution at any of the time point t6 to the time point T10 where the water repellent nozzle 23 performs supply.

Moreover, the decomposition solution mixing mechanism 43 may mix the decomposition solution from at least either the first decomposition solution mixing unit 91 or the second decomposition solution mixing unit 92 when the water repellent-containing liquid is fed to the drain facility 55. Moreover, the decomposition solution mixing mechanism 43 may mix the decomposition solution from at least either the third decomposition solution mixing unit 93 or the fourth decomposition solution mixing unit 94 when the water repellent-containing liquid is fed to the drain facility 85.

Second Embodiment

The following describes a second embodiment of the present invention with reference to the drawings. Here, the description common to that of the first embodiment is to be omitted. In the first embodiment, the first decomposition solution mixing unit 91 and the second decomposition solution mixing unit 92 are provided on a path between the chamber 3 and the drain facility 55. Moreover, the third decomposition solution mixing unit 93 and the fourth decomposition solution mixing unit 94 are provided on a path between the chamber 3 and the drain facility 85. In this regard, either the first decomposition solution mixing unit 91 or the second decomposition solution mixing unit 92 may be provided, and either third decomposition solution mixing unit 93 or the fourth decomposition solution mixing unit 94 may be provided.

Figure 8:
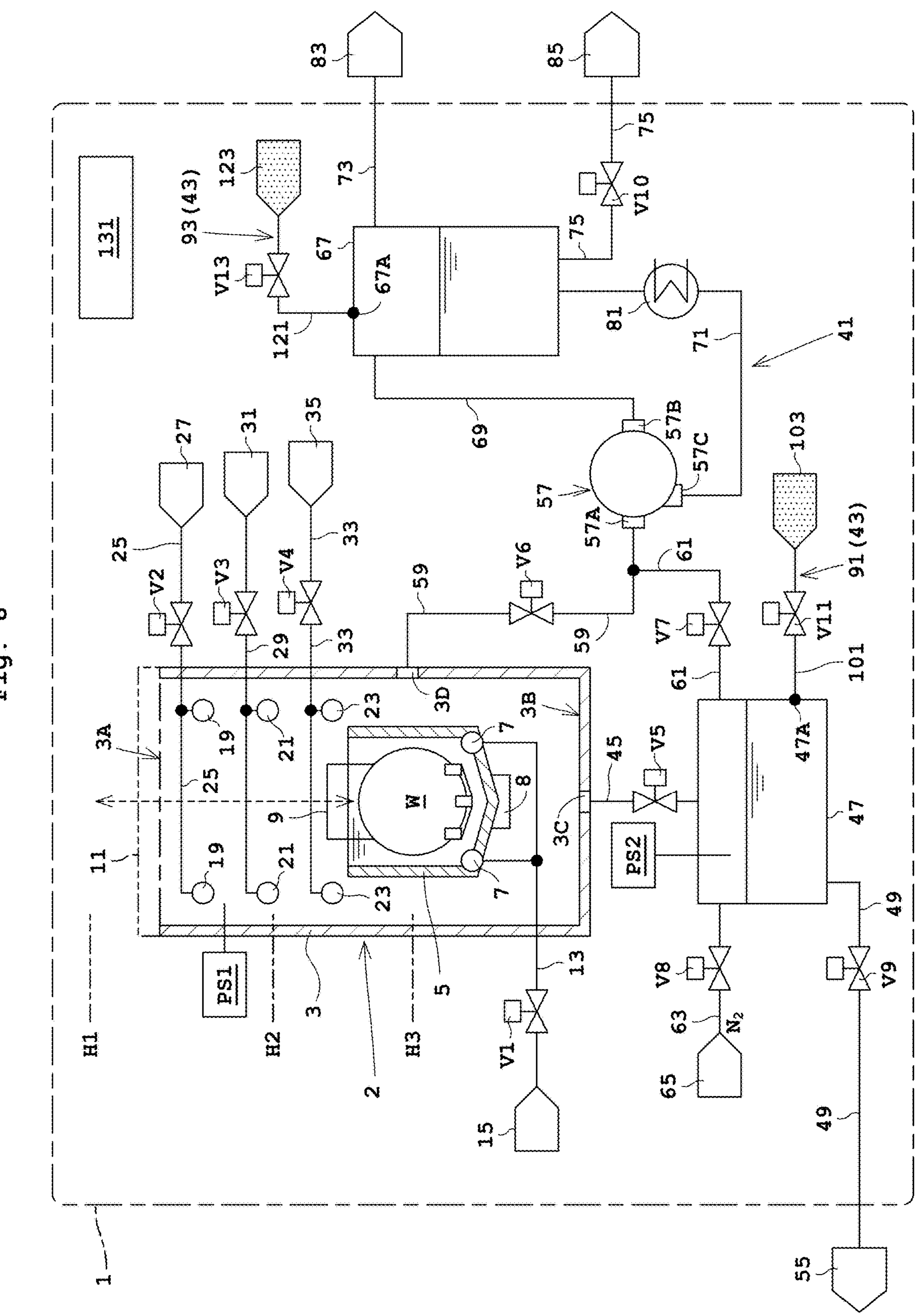
FIG. 8 schematically illustrates a substrate treating apparatus according to a second embodiment.

Reference is made to FIG. 8. The substrate treating apparatus 1 may include the first decomposition solution mixing unit 91 and the third decomposition solution mixing unit 93 without the second decomposition solution mixing unit 92 and the fourth decomposition solution mixing unit 94 shown in FIG. 1. In FIG. 8, a second end of the tank drain pipe 49 is connected to the drain facility 55 outside of the substrate treating apparatus 1. Moreover, a second end of the seal water tank drain pipe 75 is connected to the drain facility 85 outside of the substrate treating apparatus 1.

Figure 9:
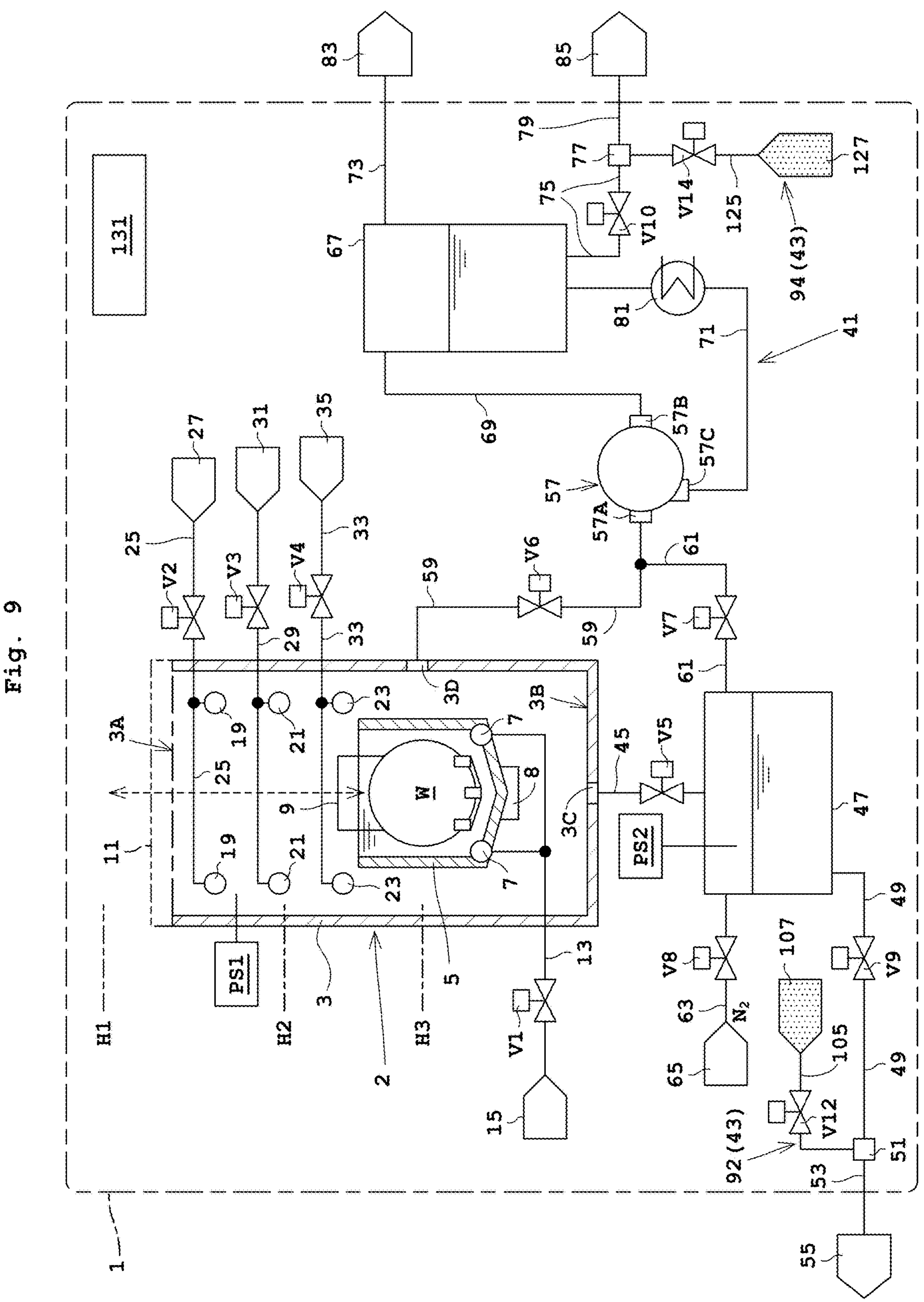
FIG. 9 schematically illustrates another substrate treating apparatus according to the second embodiment.

Reference is made to FIG. 9 for another case. The substrate treating apparatus 1 may include the second decomposition solution mixing unit 92 and the fourth decomposition solution mixing unit 94 without the first decomposition solution mixing unit 91 and the third decomposition solution mixing unit 93 shown in FIG. 1. In FIG. 9, a water repellent-containing liquid where the decomposition solution is not mixed is stored in the drain tank 47. When the water repellent-containing liquid is discharged from the drain tank 47, the second decomposition solution mixing unit 92 mixes the decomposition solution to the water repellent-containing liquid, passing the first mixing unit 51, via the first mixing unit 51. The discharging unit 41 discharges the mixed liquid to the drain facility 55 outside of the substrate treating apparatus 1 through the first mixing unit drain pipe 53.

Moreover, the seal water (water repellent-containing liquid) where the decomposition solution is not mixed is stored in the seal water tank 67 and the like. When the discharging unit 41 discharges the seal water from the seal water tank 67, the fourth decomposition solution mixing unit 94 mixes the decomposition solution to the seal water, passing the second mixing unit 77, via the second mixing unit 77. The discharging unit 41 discharges the mixed liquid of the seal water (water repellent-containing liquid) and the decomposition solution to the drain facility 85 outside of the substrate treating apparatus 1 through the second mixing unit drain pipe 79.

Moreover, the substrate treating apparatus 1 may include the first decomposition solution mixing unit 91 and the fourth decomposition solution mixing unit 94 without the second decomposition solution mixing unit 92 and the third decomposition solution mixing unit 93 shown in FIG. 1. Moreover, the substrate treating apparatus 1 may include the second decomposition solution mixing unit 92 and the third decomposition solution mixing unit 93 without the first decomposition solution mixing unit 91 and the fourth decomposition solution mixing unit 94 shown in FIG. 1.

With this embodiment, pipe clogging and pipe corrosion can be prevented especially at the outside of the substrate treating apparatus 1 and cleaning within the pipe can be made as in the first embodiment. Moreover, the substrate treating apparatus 1 according to this embodiment may be configured in a simpler manner than that of the first embodiment.

Third Embodiment

The following describes a third embodiment of the present invention with reference to the drawings. Here, the description common to that of the first and second embodiments is to be omitted. The discharging unit 41 of the first embodiment includes the drain tank 47. In this regard, a discharging unit 41 of the third embodiment does not need a drain tank 47.

Figure 10:
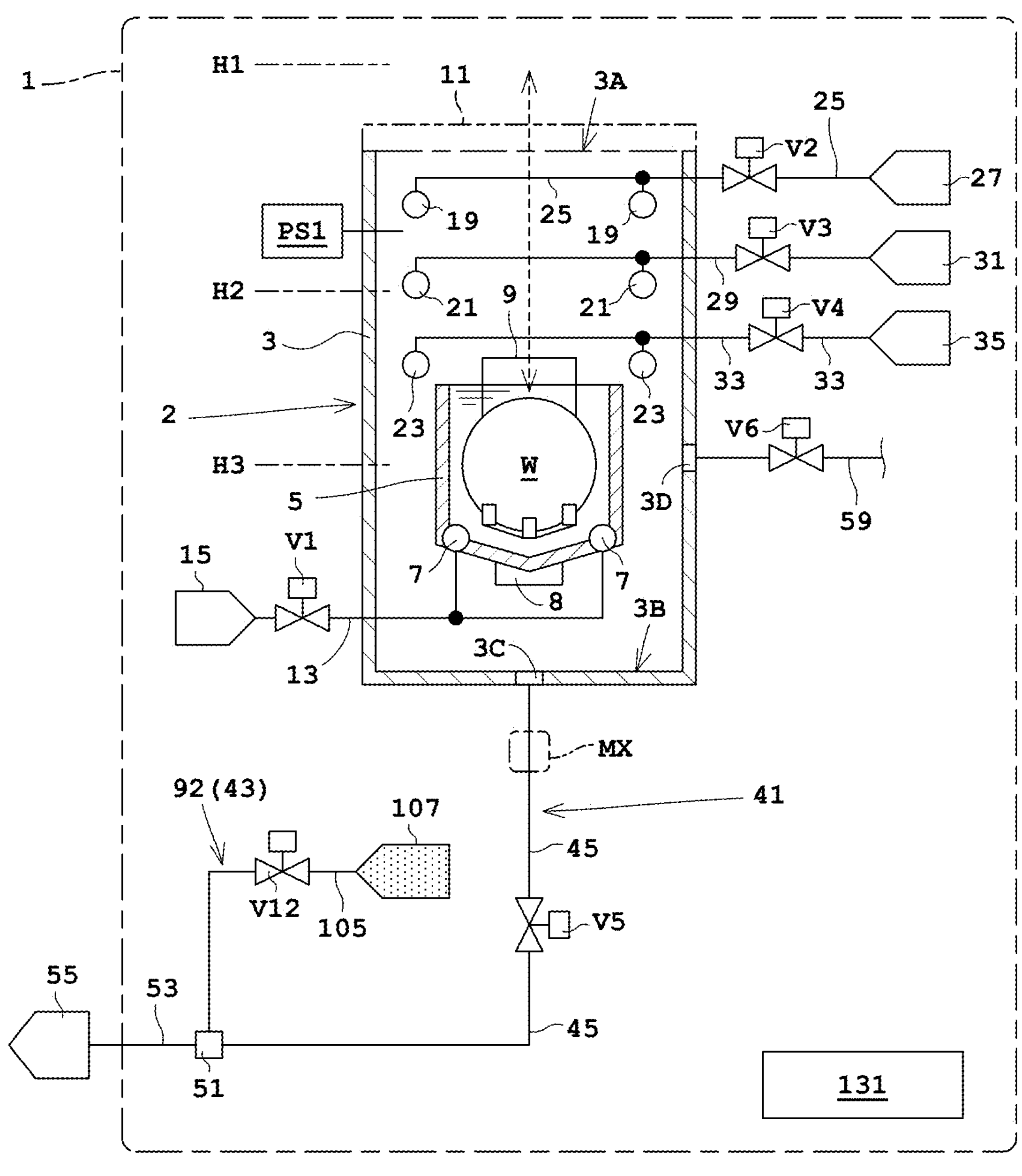
FIG. 10 schematically illustrates a substrate treating apparatus according to a third embodiment.

Reference is made to FIG. 10. The discharging unit 41 of the third embodiment includes a chamber drain pipe 45, a first mixing unit 51, and a first mixing unit drain pipe 53. A first end of the chamber drain pipe 45 is connected to a drain port 3C in a bottom of a chamber 3. A second end of the chamber drain pipe 45 is connected to the first mixing unit 51. An on-off valve V5 is provided on the chamber drain pipe 45. A first end of the first mixing unit drain pipe 53 is connected to the first mixing unit 51. A second end of the first mixing unit drain pipe 53 is connected to a drain facility 55 outside of the substrate treating apparatus 1.

When the on-off valve V5 is opened to discharge pure water containing the water-insoluble water repellent (water repellent-containing liquid) within the chamber 3, a second decomposition solution mixing unit 92 mixes a decomposition solution to the water repellent-containing liquid, passing the first mixing unit 51, via the first mixing unit 51. The discharging unit 41 discharges the mixed liquid to the drain facility 55 outside of the substrate treating apparatus 1 through the first mixing unit drain pipe 53.

In this embodiment, when the chamber 3 is decompressed, liquid cannot be discharged from the chamber 3. Accordingly, the liquid within the chamber 3 is discharged after a time point t12 where pressure within the chamber 3 returns to atmospheric pressure in FIG. 3. The second decomposition solution mixing unit 92 mixes the decomposition solution when the liquid is discharged.

Here, a first end of a chamber exhaust pipe 59 is connected to an exhaust port 3D of the chamber 3. A second end of the chamber exhaust pipe 59 is connected to a water-sealing vacuum pump 57 in FIG. 1, for example, or another decompression pump.

With this embodiment, the second decomposition solution mixing unit 92 can mix the decomposition solution via the first mixing unit 51 provided between the chamber drain pipe 45 connected to the chamber 3 and the first mixing unit drain pipe 53. The decomposition solution decomposes the water-insoluble water repellent. This prevents adhesion of a component of the water-insoluble water repellent to an inner wall of a pipe. Accordingly, pipe clogging and pipe corrosion can be prevented especially at the outside of the substrate treating apparatus 1. Moreover, cleaning within the pipe can be performed.

The present invention is not limited to the foregoing examples, but may be modified as follows.

Figure 11:
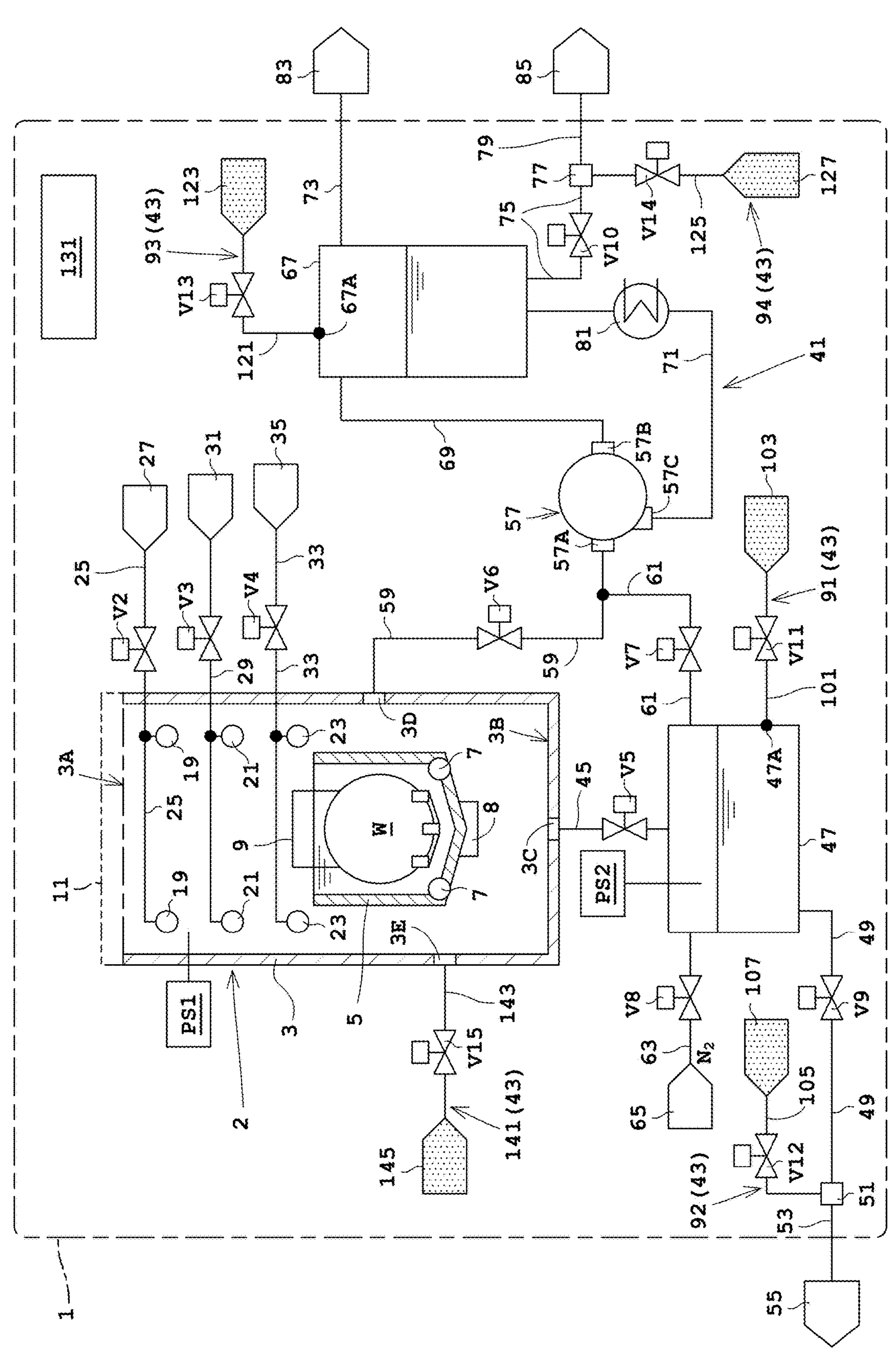
FIG. 11 schematically illustrates a substrate treating apparatus according to one modification.

(1) In the embodiments described above, the decomposition solution mixing mechanism 43 of the substrate treating apparatus 1 does not include a decomposition solution mixing unit for mixing the decomposition solution to the water repellent-containing liquid stored in the bottom of the chamber 3. In this regard, the decomposition solution mixing mechanism 43 may include such a decomposition solution mixing unit as above. Reference is made to FIG. 11. A fifth decomposition solution mixing unit 141 includes a fifth decomposition solution pipe 143, a fifth decomposition solution supplying source 145, and an on-off valve V15. A supply port 3E is provided in a wall of a lower part of the chamber 3. A first end of the fifth decomposition solution pipe 143 is connected to the supply port 3E. A second end of the fifth decomposition solution pipe 143 is connected to the fifth decomposition solution supplying source 145. The on-off valve V15 is provided on the fifth decomposition solution pipe 143.

For example, the following chamber cleaning treatment may be performed regularly. Firstly, pure water jetted from the jet pipe 7 flows out of the process tank 5 to be stored at the bottom of the chamber 3. For example, the pure water is stored until the bottom of the process tank 5 is immersed in the pure water. The pure water is stored, whereby a water repellent remaining on the lower part of the chamber 3 and an outer bottom face of the process tank 5 is contained in the pure water.

Thereafter, the fifth decomposition solution mixing unit 141 mixes a decomposition solution to the water repellent-containing liquid stored in the chamber 3 through the supply port 3E provided in the chamber 3. Consequently, the water-insoluble water repellent remaining in the chamber 3 can be decomposed. Moreover, the mixed liquid of the water repellent-containing liquid and the decomposition solution is discharged from the chamber 3, whereby the pipe through which the mixed liquid passes (e.g., chamber drain pipe 45) can be cleaned.

Moreover, the fifth decomposition solution mixing unit 141 may supply the decomposition solution through the supply port 3E before or during storing of the pure water at the bottom of the chamber 3. Accordingly, it is possible to mix the pure water containing the water repellent (water repellent-containing liquid) and the decomposition solution satisfactorily by flow of the pure water stored.

According to this modification, the mixed liquid of the water repellent-containing liquid and the decomposition solution can be discharged from the chamber 3 to the drain facility 55 outside of the substrate treating apparatus 1. Accordingly, pipe clogging and pipe corrosion can be prevented from the upstream inside the substrate treating apparatus 1.

(2) In each of the embodiments and the modification (1) described above, the second decomposition solution mixing unit 92 supplies the decomposition solution to the first mixing unit 51 provided downstream of the on-off valve V5 in FIG. 10, for example. In this regard, the second decomposition solution mixing unit 92 may supply the decomposition solution to the first mixing unit 51 provided upstream of the on-off valve V5.

For example, as shown by a numeral MX in FIG. 10, the first mixing unit 51 in this modification is provided on the chamber drain pipe 45 between the drain port 3C and the on-off valve V5. For example, the on-off valve V5 is opened to discharge the water repellent-containing liquid from the chamber 3. At this time, the second decomposition solution mixing unit 92 mixes the decomposition solution to the water repellent-containing liquid, passing the first mixing unit 51, via the first mixing unit 51. Accordingly, pipe clogging and pipe corrosion can be prevented from upstream of the on-off valve V5 provided on the chamber drain pipe 45 connected to the chamber 3.

(3) In each of the embodiments and the modifications described above, the decomposition solution mixing mechanism 43 may include at least one selected from the five decomposition solution mixing units (first decomposition solution mixing unit 91, second decomposition solution mixing unit 92, third decomposition solution mixing unit 93, fourth decomposition solution mixing unit 94, and fifth decomposition solution mixing unit 141).

(4) In each of the embodiments and the modifications described above, the discharging unit 41 includes one water-sealing vacuum pump 57. In this regard, the discharging unit 41 may include two water-sealing vacuum pumps 57. In this case, a first water-sealing vacuum pump 57 may exhaust gas within the chamber 3, and a second water-sealing vacuum pump 57 may exhaust gas within the drain tank 47. The second water-sealing vacuum pump 57 may be a decompression pump of other types.

(5) In each of the substrate treating apparatus 1 shown in FIG. 9 of the embodiments and the modifications described above, a quantity of water repellent fed from the chamber 3 to the seal water tank 67 is smaller than a quantity of water repellent fed from the chamber 3 to the drain tank 47. Accordingly, the fourth decomposition solution mixing unit 94 mixes (supplies) a smaller quantity or a lower concentration of the decomposition solution via the second mixing unit 77 than the decomposition solution that the second decomposition solution mixing unit 92 mixes (supplies) via the first mixing unit 51.

The same is applicable to the substrate treating apparatus 1 in FIG. 8. The third decomposition solution mixing unit 93 mixes a smaller quantity or a lower concentration of the decomposition solution via the supply port 67A than the decomposition solution that the first decomposition solution mixing unit 91 mixes via the supply port 47A.

(6) In each of the embodiments and the modifications described above, the first mixing unit 51 and the second mixing unit 77 are each formed by the mixer 51A shown in FIG. 2 or the mixing valve, for example. In the case where the decomposition solution is easily mixed in the water repellent-containing liquid, at least either the first mixing unit 51 or the second mixing unit 77 may be a T-tube.

Figure 12:
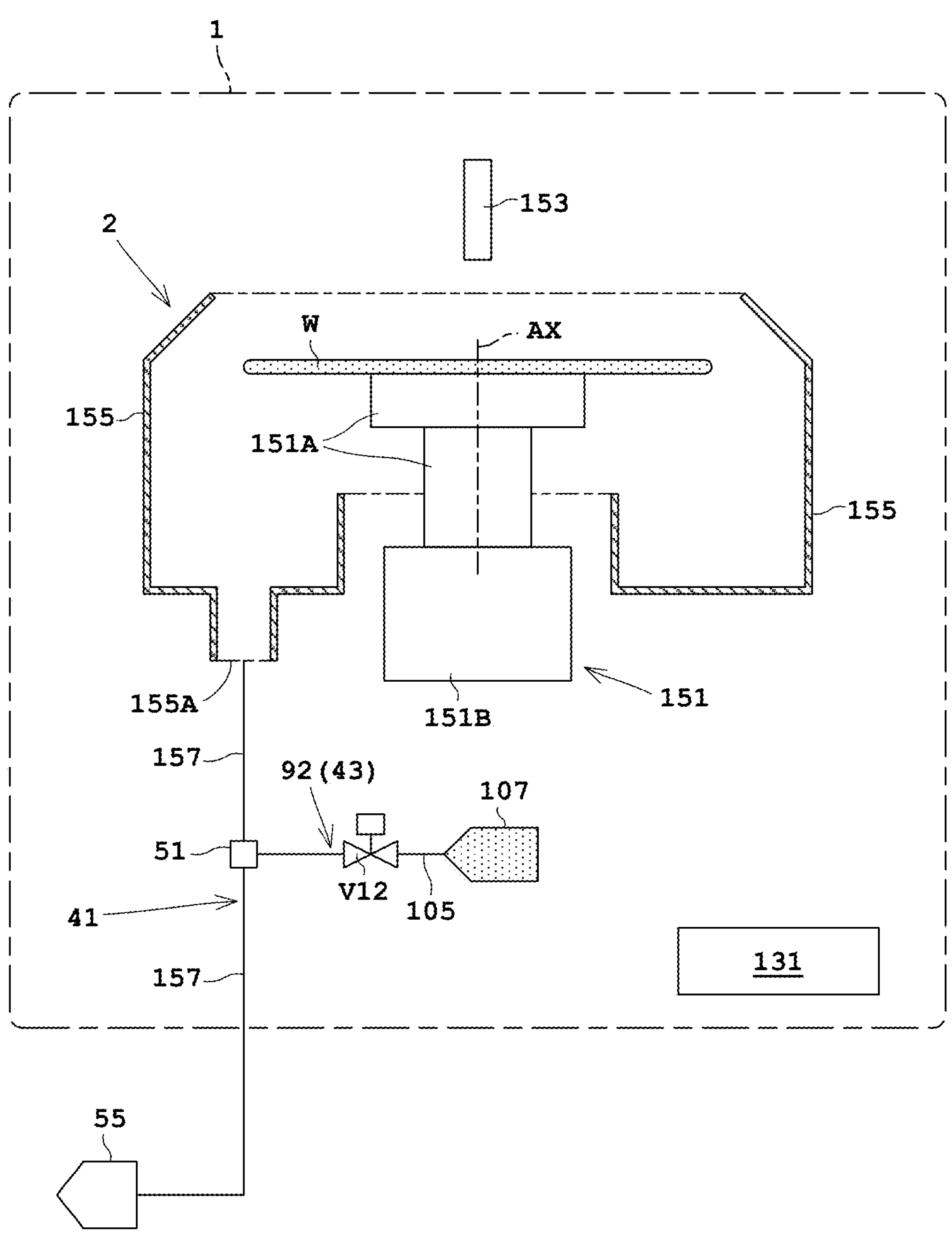
FIG. 12 schematically illustrates a substrate treating apparatus of a single-wafer processing type according to another modification.

(7) In each of the embodiments and the modifications described above, the substrate treating apparatus 1 is a batch-type device. However, the substrate treating apparatus 1 may be a single-wafer processing device that treats substrates W one by one. In FIG. 12, a substrate treating unit 2 includes a holding rotator 151, a water repellent nozzle 153, and a cup 155. The holding rotator 151 rotates while holding one substrate W. The holding rotator 151 includes a spin chuck 151A configured to hold a substrate W in a horizontal posture, and an electric motor 151B configured to rotate the spin chuck 151A around a vertical axis AX.

The water repellent nozzle 153 ejects a water-insoluble water repellent onto the substrate W held by the holding rotator 151. The cup 155 has an opening in its top face, and houses the holding rotator 151. The cup 155 receives the water repellent scattered from the substrate W. The cup 155 has a drain port 155A. A first end of the drain pipe 157 is connected to the drain port 155A, and a second end of the drain pipe 157 is connected to the drain facility 55. The first mixing unit 51 is provided on the drain pipe 157. The second decomposition solution mixing unit 92 mixes the decomposition solution to the water repellent-containing liquid, passing the first mixing unit 51 (drain pipe 157), via the first mixing unit 51.

(8) In each of the embodiments and the modifications described above, the decomposition solution mixing mechanism 43 mixes the decomposition solution to the water repellent-containing liquid. In this regard, the decomposition solution mixing mechanism 43 may supply only the decomposition solution (e.g., a liquid made by diluting an emulsifier with pure water) via at least one selected from the supply ports 3E, 47A, 67A, the first mixing unit 51, and the second mixing unit 77. For example, each pipe (e.g., chamber drain pipe 45) can be cleaned during routine maintenance.

(9) In each of the embodiments and the modifications described above, the first decomposition solution supplying source 103 feeds the decomposition solution to the supply port 47A, for example. In this regard, the first decomposition solution supplying source 103 may feed the decomposition solution to the supply port 67A of the seal water tank 67 in addition to the supply port 47A. In this case, the third decomposition solution supplying source 123 is not provided. That is, the first decomposition solution mixing unit 91 may also have at least a function of the third decomposition solution mixing unit 93.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate, comprising:

a substrate treating unit configured to supply a water-insoluble water repellent to the substrate to perform water-repellent treatment to the substrate;

a decomposition solution mixing mechanism configured to mix a decomposition solution for decomposing the water repellent to a water repellent-containing liquid that contains the water repellent as a waste liquid generated through the water-repellent treatment; and a discharging unit configured to discharge a mixed liquid of the water repellent-containing liquid and the decomposition solution to an outside of the substrate treating apparatus, wherein the substrate treating unit includes:

a chamber configured to accommodate the substrate; and a water repellent nozzle configured to supply the water repellent to the substrate accommodated in the chamber, the decomposition solution mixing mechanism includes a first decomposition solution mixing unit, the discharging unit includes:

a water-sealing vacuum pump configured to exhaust gas within the chamber;

a seal water tank configured to store seal water;

a pump exhaust pipe configured to connect the water-sealing vacuum pump and the seal water tank for feeding gas in the chamber and the seal water from the water-sealing vacuum pump to the seal water tank;

a circulating pipe configured to connect the seal water tank and the water-sealing vacuum pump for returning the seal water from the seal water tank to the water-sealing vacuum pump;

a seal water tank exhaust pipe whose first end is connected to the seal water tank; and a seal water tank drain pipe whose first end is connected to the seal water tank, the first decomposition solution mixing unit mixes the decomposition solution to the seal water as the water repellent-containing liquid, stored in the seal water tank, via a supply port provided in the seal water tank, and the discharging unit discharges the seal water through the seal water tank drain pipe to the outside of the substrate treating apparatus when discharging the seal water as the mixed liquid within the seal water tank.

2. The substrate treating apparatus according to claim 1, wherein the decomposition solution mixing mechanism further includes a second decomposition solution mixing unit, the discharging unit includes:

a chamber drain pipe whose first end is connected to the chamber;

a mixing unit connected to a second end of the chamber drain pipe; and a mixing unit drain pipe whose first end is connected to the mixing unit, the second decomposition solution mixing unit mixes the decomposition solution to the water repellent-containing liquid, passing through the mixing unit, via the mixing unit, and the discharging unit discharges the mixed liquid through the mixing unit drain pipe to the outside of the substrate treating apparatus.

3. The substrate treating apparatus according to claim 2, wherein the decomposition solution mixing mechanism further includes a third decomposition solution mixing unit, and the third decomposition solution mixing unit mixes the decomposition solution to the water repellent-containing liquid stored in the chamber via a supply port provided in the chamber.

4. The substrate treating apparatus according to claim 1, wherein the discharging unit includes:

a chamber drain pipe whose first end is connected to the chamber;

a drain tank connected to a second end of the chamber drain pipe; and a tank drain pipe whose first end is connected to the drain tank, the decomposition solution mixing mechanism further includes a second decomposition solution mixing unit, the second decomposition solution mixing unit mixes the decomposition solution to the water repellent-containing liquid, stored in the drain tank, via a supply port provided in the drain tank, and the discharging unit discharges the mixed liquid through the tank drain pipe to the outside of the substrate treating apparatus.

5. The substrate treating apparatus according to claim 4, wherein the discharging unit further includes a decompression pump configured to exhaust gas within the chamber and the drain tank, the decompression pump decompresses the chamber and decompresses the drain tank such that a tank pressure value in the drain tank is made lower than a chamber pressure value in the chamber, the water repellent nozzle supplies the water repellent while the chamber is decompressed, and the discharging unit discharges the water repellent-containing liquid stored in the chamber to the drain tank through the chamber drain pipe when the tank pressure value is lower than the chamber pressure value and the water repellent nozzle supplies the water repellent.

6. The substrate treating apparatus according to claim 1, wherein the first decomposition solution mixing unit mixes the decomposition solution to the seal water as the water repellent-containing liquid stored in the seal water tank via the supply port provided in the seal water tank when the water-sealing vacuum pump operates for decompressing the chamber and the water repellent nozzle supplies the water repellent.

7. A substrate treating apparatus for treating a substrate, comprising:

a substrate treating unit configured to supply a water-insoluble water repellent to the substrate to perform water-repellent treatment to the substrate;

a decomposition solution mixing mechanism configured to mix a decomposition solution for decomposing the water repellent to a water repellent-containing liquid that contains the water repellent as a waste liquid generated through the water-repellent treatment; and a discharging unit configured to discharge a mixed liquid of the water repellent-containing liquid and the decomposition solution to an outside of the substrate treating apparatus, wherein the substrate treating unit includes:

a chamber configured to accommodate the substrate; and a water repellent nozzle configured to supply the water repellent to the substrate accommodated in the chamber, the decomposition solution mixing mechanism includes a first decomposition solution mixing unit, the discharging unit includes:

a water-sealing vacuum pump configured to exhaust gas within the chamber;

a seal water tank configured to store seal water;

a pump exhaust pipe configured to connect the water-sealing vacuum pump and the seal water tank for feeding gas in the chamber and the seal water from the water-sealing vacuum pump to the seal water tank;

a circulating pipe configured to connect the seal water tank and the water-sealing vacuum pump for returning the seal water from the seal water tank to the water-sealing vacuum pump;

a seal water tank exhaust pipe whose first end is connected to the seal water tank;

a seal water tank drain pipe whose first end is connected to the seal water tank;

a second mixing unit connected to a second end of the seal water tank drain pipe; and a second mixing unit drain pipe whose first end is connected to the second mixing unit, the first decomposition solution mixing unit mixes the decomposition solution to the seal water, passing through the second mixing unit, via the second mixing unit when the discharging unit discharges the seal water as the water repellent-containing liquid from the seal water tank, and the discharging unit discharges the mixed liquid through the second mixing unit drain pipe to the outside of the substrate treating apparatus.

* * * * *